United States Patent
Bayer

(10) Patent No.: US 11,674,835 B2
(45) Date of Patent: Jun. 13, 2023

(54) FLOWMETER

(71) Applicant: Alwin Bayer, London (GB)

(72) Inventor: Alwin Bayer, Fuerth (DE)

( * ) Notice: Subject to any disclaimer, the term of this patent is extended or adjusted under 35 U.S.C. 154(b) by 232 days.

(21) Appl. No.: 17/236,628

(22) Filed: Apr. 21, 2021

(65) Prior Publication Data

US 2021/0341325 A1   Nov. 4, 2021

(51) Int. Cl.
G01F 1/716 (2006.01)
G01F 25/00 (2022.01)
G01F 1/74 (2006.01)
G01F 25/10 (2022.01)

(52) U.S. Cl.
CPC ............... G01F 1/716 (2013.01); G01F 1/74 (2013.01); G01F 25/10 (2022.01)

(58) Field of Classification Search
CPC .. G01R 33/307; G01R 33/383; G01R 33/448; G01R 33/3806; G01F 1/74; G01F 1/716; G01F 25/10; G01N 24/08
See application file for complete search history.

(56) References Cited

U.S. PATENT DOCUMENTS

| | | | | |
|---|---|---|---|---|
| 5,684,399 A * | 11/1997 | Bayer | ............. | G01F 1/716 324/306 |
| 6,046,587 A * | 4/2000 | King | ............. | G01V 3/14 324/309 |
| 2003/0006768 A1 * | 1/2003 | Kleinberg | ............. | G01V 3/32 324/303 |
| 2004/0027122 A1 * | 2/2004 | Heaton | ............. | G01N 24/081 324/303 |
| 2006/0250130 A1 * | 11/2006 | Akkurt | ............. | G01N 24/081 324/303 |
| 2014/0015526 A1 | 1/2014 | Bousché et al. | | |

* cited by examiner

Primary Examiner — Jermele M Hollington
Assistant Examiner — Suresh K Rajaputra
(74) Attorney, Agent, or Firm — Clement Cheng

(57) ABSTRACT

Flow measurement of hydrogen density, volumetric concentrations, and longitudinal relaxation times and transverse relaxation times have all n components in pairs different to each other. The method has the steps of: enclosing a mixture inside a probe volume and polarizing the mixture with a magnetic field; measuring the mixture enclosed inside the probe volume in terms of its longitudinal or transverse relaxation behaviour by means of pulsed electromagnetic waves at least n times with a different volumetric share of its components to measure at least n different relaxation curves; obtaining the relaxation times from the relaxation curves; obtaining the thermal equilibrium magnetizations $M_0$ of the individual components from the relaxation curves; and correlating yielded thermal equilibrium magnetizations $M_0$ of the individual components to calculate the hydrogen densities and the volumetric share of the components for each relaxation curve.

12 Claims, 12 Drawing Sheets

FLOWMETER

The present invention claims priority from European patent application EP20020204.2 entitled In-Situ Measurement of Relaxation Times, Hydrogen Densities and Volumetric Concentrations by Means of NMR filed May 1, 2020, by same inventor Alwin BAYER the disclosure of which is incorporated herein by reference.

FIELD OF THE INVENTION

The present invention relates to determining NMR properties of the individual components of a multi-component flow in situ by using nuclear magnetic resonance (NMR) techniques.

DISCUSSION OF RELATED ART

Exact determination of NMR parameters of the flow components is essential to operate NMR (nuclear magnetic resonance) flowmeters with improved accuracy in hydrocarbon production systems. The measured NMR parameters also allow monitoring of the build up of pipe blocking substances, such as hydrates and wax in hydrocarbon production systems. Such information allows operation of flow assurance systems in a more economical way with reduced safety margins. The principles of nuclear magnetic resonance (NMR) provide an excellent basis to construct and operate an apparatus that performs this task in-situ. Such applications of the NMR principle have not been practised at the present time.

Multi-component flows occur in various areas of technology. Amongst them is, for example, production from oil wells, which can be a mixture of oil and water. If the individual flow rates of such flows are to be measured with metering principles based on magnetic resonance methods as described, for example, in U.S. Pat. No. 5,684,399, it is important to routinely measure the relaxation times of the individual components of a multi-component mixture, characterised by the longitudinal relaxation times. Only with an accurate knowledge of the longitudinal relaxation time $T_1$, for example, is it possible to calculate the equilibrium magnetizations as disclosed in equation (6) and (7) of U.S. Pat. No. 5,684,399, which in turn are needed to obtain the individual mass flow rates of a multi-component flow.

Other publications such as U.S. Patent publication No. 20140015526A1 have recognized the need of measuring the relaxation times of the individual components of a multi-component mixture for NMR flow measurements, as well and they also propose using a bypass in order to reduce production down times. The technology disclosed in U.S. Patent publication No. 20140015526A1, however, requires some a priori knowledge of the hydrogen density of the measured materials in order to work out the volumetric share of each component present in the mixture. The hydrogen density of the individual components of multiphase mixture depends on its chemical composition and its physical properties like pressure and temperature and cannot be derived accurately from theory. Thus, a technology enhancement is needed.

The cited prior art references are incorporated herein by reference.

SUMMARY OF THE INVENTION

Another desirable information is the knowledge on the transverse relaxation time $T_2$ of the individual components of a multi-component mixture. Transverse relaxation times are substantially different for solids and liquids and provide a convenient means for distinguishing between solid and liquid material in hydrocarbon flow lines. The transverse magnetization of hydrogen in solids such as wax or hydrates, in general, decays within several µs (microseconds), whereas the transverse magnetization of hydrogen bearing liquids, such as oil, decays within hundreds of milliseconds. By analysing the transverse relaxation curve, it is possible to determine the amount of hydrogen contained in the solid material and the liquid material as two separate values without physically separating the two components. Such a feature is important in oil and gas production to determine the volumetric share of wax or hydrates to avoid pipe blocking production outages. To avoid production outages, the oil and gas production uses flow ensuring systems which rely, for example, on injection of chemicals or input of thermal energy to prevent the pipes from blocking. To keep flow ensuring systems working reliably they need to operate on a preventative basis, i.e. more chemicals than necessary are injected or more thermal energy than necessary is applied to a production flow line. All this adds cost to the oil and gas production process. With a reliable detection of waxes and hydrates, flow assurance systems can be operated closer to the absolutely necessary limit allowing significant savings on energy and chemicals.

Another desirable bit of information is the volumetric concentrations of the individual components of a multi-component mixture enclosed in a pipe segment. For example, in oil production it is important for economic reasons to determine the water cut of the crude oil. In oil production, the produced water needs to be treated with separators to remove as much oil as possible before it is discharged into the environment. If the water cut of the fluid produced by the wellhead increases, costs for treatment increase whereas revenues achieved by selling the oil go down. There is a certain point where it becomes un-economical to operate the oil well any longer. To find the optimum point for shutting down the well, it is desirable to determine the volumetric share or ratio of oil and water.

Another desirable bit of information is the hydrogen density of the individual components of a multi-component mixture enclosed in a pipe segment. In NMR, the NMR signal of hydrogen bearing substances is obtained by means of a coil which picks up the electromagnetic waves emitted by the nuclei located inside the effective sensor volume of a RF-coil (radio frequency coil) after the nuclei have been excited with a high-power burst of electromagnetic waves. The RF-coil is placed inside a static magnetic field for this purpose. The frequency response by the nuclei induces an alternating current in the RF-coil, which is picked up by the electronic circuitry of the NMR detection apparatus. The signal amplitude depends on the number of nuclei contained in the effective volume of the RF-coil. For hydrocarbons, the nuclei of interest are hydrogen nuclei. The more hydrogen nuclei there are in a reference volume of 1 $cm^3$ (one cubic centimeter), for example, the higher the hydrogen density and hence the obtained signal amplitude will be. For pure substances with a known chemical composition, such as pure water ($H_2O$), it is possible to derive the number of nuclei in a reference volume from theory, as the molecular weight and the density of the substance is known. If the substance has unknown impurities (e.g. significant amount of NaCl dissolved in water), it is no longer possible to determine the hydrogen density of such brines theoretically. In industry, it therefore was found to be useful to introduce the hydrogen index (HI) as comparative parameter. HI is an dimensionless number which compares the hydrogen density of the substance of interest against the hydrogen density of pure water at reference conditions. Further reading can be found in technical literature, e.g.: "NMR Properties of Reservoir Fluids", Kleinberg, Robert & Vinegar, H. J. (1996). NMR properties of reservoir fluids. Log Analyst. 37. 20-32. The hydrogen density is crucial to know for any NMR flow meter as an input parameter. Only with a precise knowledge of this material specific parameter the measured NMR signal can be converted into mass flow rates accurately.

Another use for the information and data of hydrogen density is with gas grid operators. To accommodate more renewable energy sources, gas grid operators need to blend hydrogen gas generated by renewable energy sources with fossil methane in order to lower the dependence on fossil fuels for energy consumption. Methane ($CH_4$) and Hydrogen gas ($H_2$) differ by a factor of 2 in terms of hydrogen density. So this provides a convenient parameter to distinguish between the two components and determine mixture concentrations in binary gas grids.

It is practically not possible to determine the hydrogen density of an undefined substance directly by means of NMR since neither the exact value of the average molecular weight nor the exact value of the density of an undefined hydrogen bearing substance is known. To solve this problem, a different approach in this disclosure is taken: rather than referring to water as a reference material with the hydrogen index as term for it, it is preferred to stick to the definitions of a hydrogen density as outlined before, i.e. the NMR signal strength of a substance occupying 100% of the effective sensor volume of an RF-coil. Instead of comparing hydrogen bearing materials to water, they are compared directly against each other. In hydrocarbon production, the hydrogen density of crude oil, in general, is higher than the hydrogen density of the gas fraction, which is dominated by methane. If the components of the mixture differ also in their relaxation behavior (be it longitudinal or transverse) it is possible to cross-correlate the readings in an advantageous manner as will be shown in more detail below. The only requirement is that several measurements of the relaxation curves are carried out, where the volumetric ratio of the components of the mixture is varied for each measurement. Such cross-correlated signal evaluation has not been practiced so far.

Another object of this invention is to do without sampling techniques and analyse the individual components of a multi-component flow with NMR techniques in-situ. The conventional way of sampling a small portion of the flow and transporting the sample into a laboratory for analysis with NMR machines has several significant disadvantages. Firstly, such a method is very time-consuming. Secondly, the routine transport of samples to the laboratory may be difficult and expensive. A more elegant way of analysing the individual components of a multi-component mixture with NMR techniques is therefore provided with this invention, where a segment of interest of the flow is trapped between two valves fitted to the flow line, and where a NMR measurement apparatus placed between these two valves analyses the material enclosed in the pipe section between the two valves. Pressure and temperature of the mixture have an influence on the results of the analysis, but the suggested way of trapping the mixture in-line keeps temperature and pressure of entrapped mixture close to that experienced under flow conditions making sure the analysis results are valid. Such an in-line characterization of the flow constituents of an oil well may be particularly important when the well is underwater or in a location difficult to access. To avoid costly production outages, the system of valves may be supplemented with a bypass which is activated when the NMR measurement apparatus analyzes the entrapped material.

Entrapping the mixture this way has also the benefit of being able to control the pressure and temperature of the enclosed mixture. A poor control of the mixture temperature, for example, results in poor accuracy for the measured relaxation data. This is one of the reasons why conventional NMR spectrometer used in the laboratory possess a means to regulate operation temperature for the NMR sensor. When applying NMR for process measurements, it is far more difficult to keep the temperature of the process fluid within a narrow bandwidth since it is not practical to thermally control the oncoming process fluid. The NMR sensor is in contact with a long, thermally conducting process pipe, where any temperature changes of the environment will pass through to the NMR sensor. If that pipe section enclosed between two valves is heated up or cooled down, it is possible to narrow down the temperature fluctuations induced by the environment.

Catching a segment of e.g. a crude oil and gas mixture in the process pipe between two valves and exposing the mix to an external magnetic field allows the mix to reach a well defined thermal equilibrium in terms of both mixture temperature and mixture magnetization. A convenient side effect of doing this is that this provides also a means for controlling the volumetric share of the oil and gas in this example. Crude oil and gas dissolve each other to a certain extent which depends on the pressure and temperature of the mixture. If the temperature is raised, for example, gas comes out of solution causing a shrinking of the crude oil fraction. The same happens if the pressure is lowered.

Being able to vary the temperature and the pressure of the enclosed mixture allows modifying the volumetric concentrations of the individual components of a multi-component mixture, where the volumetric ratio of the components of the mixture is varied for each measurement for cross-correlation purposes as described above. Such methods have not been practiced so far.

Another object of the invention is to provide an additional means for varying the volumetric content of the components of a mixture trapped between a process pipe and two valves by means of additional valves which act as a bleed or fill in to vary the amount of oil and gas, for example, of an oil and gas mixture.

Another object of the invention is to provide a means of generating an inhomogeneous distribution of the components of the multi-component mixture within the measurement apparatus by inclining the measurement apparatus. (In this context, the measurement apparatus has a pipe section enclosed between two valves and several NMR sensors positioned along this pipe section.) Such a step is very advantageous since mixtures such as oil and water tend to separate due to density differences of the individual components. In an inclined measurement apparatus, the heavier fraction, such as water, will always settle at the bottom whereas lighter components, such as oil, will rise to the top generating a range of different oil and water concentrations of the mix along the pipe in the inclined apparatus. A separation like this makes the apparatus mechanically extremely simple and rugged.

In accordance with a first aspect of the invention there is provided a method for measuring the hydrogen density, the volumetric concentration as well as longitudinal and/or transverse relaxation times of the individual components of a multi-component mixture consisting of n components by means of nuclear magnetic resonance.

To achieve this, it is required that the individual components of a multi-component mixture have different relaxation times to distinguish between them. This can either be a difference in the longitudinal relaxation behaviour or a difference in the transverse relaxation behaviour of the individual components of the mixture. The method described, however, will also work if the individual components of the mixture differ in both their longitudinal and transverse relaxation behaviour.

The method requires that the mixture is enclosed in a probe volume and polarized by means of an external magnetic field. Such a polarized mixture can be examined in terms of its relaxation behaviour by means of pulsed NMR where the hydrogen nuclei of the mixture are interrogated by electromagnetic waves. If the volumetric composition of the mixture inside the sensor zone of the applicable RF-coil is varied after each relaxation measurement (be it a transverse relaxation measurement or a longitudinal relaxation measurement), several relaxation curves are obtained which differ from each other. For a mixture consisting of n components, at least n such different relaxation curves are sampled.

The relaxation curves obtained are used to extract the information on the longitudinal and/or transverse relaxation times of the individual components of the mixture. Furthermore, the thermal equilibrium magnetizations of the individual components of the mixture are obtained from the relaxation curves. The obtained thermal equilibrium magnetizations of the different relaxation measurements can be correlated such that the volumetric concentrations and the hydrogen densities of the individual components are determined for each relaxation measurement. This advantageous cross-correlation of several relaxation curves is only possible if at least n relaxation curves have been sampled with different volumetric concentrations of each mixture component. To achieve different volumetric concentrations there are several ways in principle, namely way or method a, b, and c.

Method a) is to generate a local variation of volumetric concentrations of the mixture components which are sensed by several RF coils located at different positions along the probe volume, in which the mixture is enclosed. In this manner the sensitive volumes of the RF-coils see different volumetric concentrations of the mixture components when they interrogate the mixture in terms of relaxation behaviour.

Method b) is to generate a variation of volumetric concentrations of the mixture components in time. After each relaxation measurement, the volumetric concentrations of the mixture components are changed in the sensitive volume of the used RF-coil by feeding in and/or discharging material. As such a method can lead to pressure and temperature changes effecting hydrogen density of the mixture components, pressure and temperature of the mixture enclosed inside the probe volume are logged for each relaxation curve measured.

Method c) again is to generate a variation of volumetric concentrations of the mixture components in time. After each relaxation measurement, the volumetric concentrations of the mixture components are changed in the sensitive volume of the used RF-coil by changing pressure and/or temperature. By changing pressure and/or temperature, the phase equilibrium between the mixture components is changed, which in turn, changes the volumetric concentrations of mixture components. Again, as such a method can lead to pressure and temperature changes effecting hydrogen density of the mixture components, pressure and temperature of the mixture enclosed inside the probe volume are logged for each relaxation curve measured.

No matter whether way a, b or c is chosen, it is advantageous to route the oncoming process media (the multi-component mixture) through an activated bypass around the enclosed probe volume, as long as the relaxation measurements are carried out, to avoid production outages.

To ensure the gathered data on relaxation times and hydrogen densities is valid also in a flow-situation, after in-line characterization of the fluid has been finished, it is recommended to continue pressure and temperature measurements and compare them against the pressure and temperature values experienced during in-line characterization of the fluid. If there are signification shifts in pressure and/or temperature it is recommended to repeat the in-line characterization of the fluid.

Another aspect of the invention includes a hydrogen density measurement apparatus, the volumetric concentration as well as longitudinal and/or transverse relaxation times of the individual components of a multi-component mixture have n components by means of nuclear magnetic resonance according way a), way b) or way c) as defined above. Again, as for the method described before, it is required that the individual components of a multi-component mixture have different relaxation times in order to distinguish between them. This can either be a difference in the longitudinal relaxation behaviour and/or a difference in the transverse relaxation behaviour.

The apparatus encloses a probe volume between two valves at the entrance and the exit. At least one RF-coil is placed with its sensitive volume towards the probe volume. In order to vary the volumetric concentrations of the components of the mixture, there are three ways in principal:

Way a) is to generate a local variation of volumetric concentrations of the components of the mixture inside the probe volume by mixture separation and use several RF coils placed at different positions. These positions are arranged such that in each sensing volume of respective RF-coil a different volumetric concentration exists for each component of the mixture.

Each of the RF-coils is placed inside an external magnetic field and connected to a NMR detection apparatus, which generates, detects and processes nuclear magnetic resonance signals.

Way b) and way c) generate a variation of volumetric concentrations of the components of the mixture inside the probe volume in time.

In way b), the volumetric concentrations of the enclosed mixture components are varied by providing a means for feeding in and/or discharging material. In order to track changes of pressure and temperature of the enclosed mixture, the apparatus is fitted with a pressure and temperature sensor.

In way c), the volumetric concentrations of the enclosed mixture components are varied by providing a means to change the temperature and/or the pressure of the mixture enclosed in the probe volume. In order to track changes of pressure and temperature of the enclosed mixture, the apparatus is also fitted with a pressure and temperature sensor.

All apparatuses discussed so far can be fitted with a tank circuit damping device to vary the damping coefficient in time. The tank circuit damping device can be shorten the dead times of the RF-coils attached to the NMR electronic circuitry during the NMR pulse excitation experiment. This assists in the measurement of transverse relaxation curves for hydrogen bearing solid materials with very short transverse relaxation times $T_2$. Such a feature is also useful if the static magnetic field suffers from low field homogeneity, which in turn, causes the loss of a significant amount of the initial signal amplitude of a free induction decay (a so-called FID) during the dead time. After switching off the pulse generator for the excitation pulse, a high damping coefficient is applied to shorten the dead time of the NMR electronic circuitry. Before the signal receiver of the NMR detection apparatus is enabled, a low damping coefficient is applied to get a strong NMR signal to be picked up in the receiver unit.

All apparatuses discussed so far can be designed to have a probe volume of long geometry, preferably inclined towards the horizontal line. Such a feature assists to generate a local variation of the volumetric concentrations of the mixture components along the length of the probe volume when natural gravity is used for separation of the mixture enclosed inside the probe volume. All apparatuses discussed so far can be designed to have RF coils which have a shorter diameter than the smallest cross-section of the probe volume. Such remote sensing RF-coils have a magnetic field of small volume and hence keep the amount of electromagnetic energy of the RF pulse low. This shortens the dead times of the RF-coil attached to the NMR detection apparatus. Again, such a feature is useful when measuring the transverse relaxation curves of hydrogen bearing solid materials since this requires short dead times of the NMR detection apparatus attached to the corresponding RF coil. Using smaller sensing volumes for the RF-coils also lowers field homogeneity requirements on the static magnetic field. All apparatuses discussed so far can be fitted with a bypass line which ensures the oncoming flow (i.e. the oncoming multi-component mixture) is routed around the enclosed probe volume of the apparatus. Such a bypass line helps to avoid production outages while the apparatus is measuring the entrapped mixture. All apparatuses discussed so far can be fitted with a continuous pressure and temperature measurement. Such measurements allows to detect pressure and temperate of the process flow drifting away from the pressure and temperature encountered during in-line characterization of the entrapped mixture material.

SUMMARY OF THE CLAIMS

A method of measurement of hydrogen density, volumetric concentrations, and longitudinal relaxation times and transverse relaxation times of individual components of a multi-component mixture having n components by means of nuclear magnetic resonance, wherein the longitudinal relaxation times or the transverse relaxation times of all n components in pairs are different to each other has the steps of: enclosing a mixture inside a probe volume and polarizing the mixture with a magnetic field; measuring the mixture enclosed inside the probe volume in terms of its longitudinal or transverse relaxation behaviour by means of pulsed electromagnetic waves at least n times with a different volumetric share of its components to measure at least n different relaxation curves; obtaining the relaxation times from the relaxation curves; obtaining the thermal equilibrium magnetizations $M_0$ of the individual components from the relaxation curves; and correlating yielded thermal equilibrium magnetizations $M_0$ of the individual components to calculate the hydrogen densities and the volumetric share of the components for each relaxation curve.

The method may also have the steps of: generating different relaxation curves from local variations of volumetric concentrations of the mixture components inside the probe volume; and in which several RF coils are used, each of them having the mixture components present in its sensitive volumes in different volumetric shares. Optionally, the method may generate different relaxation curves with at least one RF coil, in whose sensitive volume the volumetric share of the components of the mixture is varied in time by feeding in and/or discharging material, and measure pressure and temperature inside the probe volume for each relaxation curve.

Optionally, the different relaxation curves are generated by using at least one RF coil, in whose sensitive volume a change of the phase equilibrium of the mixture is achieved by changing the pressure or the temperature or by changing the pressure and the temperature, which in turn, varies the volumetric share of the components of the mixture in time, and wherein pressure and temperature inside the probe volume are measured for each relaxation curve also. The measurement a bypass is activated which routes the multi-component mixture around the lockable probe volume in order to avoid process outages. Pressure and temperature of the mixture are continuously measured in order to verify whether the measured pressure and/or temperature of the free flowing mixture drifts when comparing it to the previously measured enclosed mixture.

An apparatus for measurement of hydrogen density, volumetric concentrations, longitudinal and/or transverse relaxation times of the individual components of a multi-component mixture consisting of n components by means of nuclear magnetic resonance, where at least the longitudinal or the transverse relaxation times of all n components in pairs are different to each other, includes at least one probe volume with valves at the entrance and exit, which enclose the mixture to be measured in the probe volume; at least one first RF coil comprising a sensitive volume in which the at least one first RF coil is sensitive for RF signals, wherein the at least one first RF coil is placed at a first position along the probe volume with its sensitive volume towards the probe volume in order to receive RF signals emitted in the probe volume; a means for variation of the volumetric share of the mixture components inside the probe volume, selected from the following group of: a means for generating a local variation of the volumetric concentration of the mixture components by separation inside the probe volume, wherein at least one second RF coil is placed at a second position along the probe volume different to the first position in such a way that the at least one first RF coil and the at least one second RF coil find different volumetric concentrations of the mixture inside their sensitive volumes; a means for generating a variation of the volumetric concentration of the mixture components inside the probe volume and thereby in the sensitive volume of the at least one first RF coil in time by feeding in and/or discharging material to the mixture enclosed inside the probe volume, and which comprises at least one pressure sensor and one temperature sensor for the mixture enclosed inside the probe volume; or a means for changing the temperature and/or the pressure of the multi-component mixture enclosed inside the probe volume in order to generate a variation of the volumetric concentration of the mixture components inside the sensitive volume of the at least one first RF coil in time, and which comprises at least one pressure sensor and one temperature sensor for the mixture enclosed inside the probe volume; at least one magnet device which is arranged such that the sensitive volume of each RF-coil is placed in the magnetic field of the magnet device; at least one NMR detection apparatus comprising a pulse generator for generation of excitation pulses and a receiver for the detection of nuclear magnetic resonance signals which is connected to the RF coils; and a device for evaluation of the oncoming signals and control of actuators attached to the apparatus.

The damping coefficient is configured to be variable in time to dampen the alternating field of the RF coils. A lockable probe volume is of elongated geometry, preferably inclined in its axis towards the horizon.

At least one RF coil has a diameter shorter than the smallest cross-sectional width of the probe volume containing the multi-component mixture. A blockable bypass which is fitted such that the multi-component mixture can flow around the lockable probe volume for the duration of the measurement. The preferably has a continuously operating pressure and temperature sensor.

Figure 1:
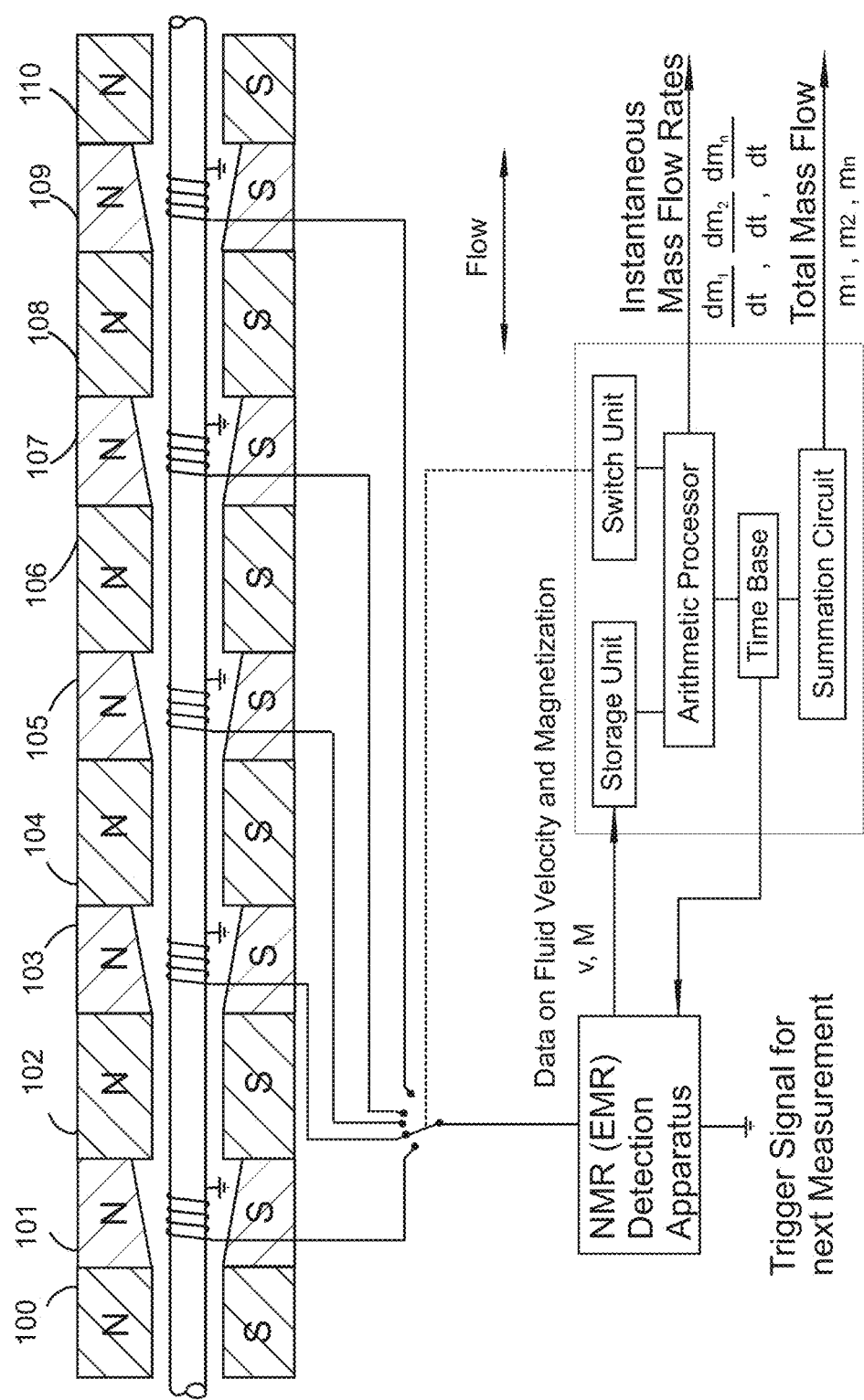
FIG. 1 shows the prior art U.S. Pat. No. 5,684,399 apparatus for measuring individual mass flow rates of a multi-component flow and is the existing state of the art.

The following callout list of elements can be a useful guide in referencing the element numbers of the drawings.

243, 505 pipe
244, 245 pipe valve
246, 247, 248, 249, 250 magnets
251, 252, 253, 254, 255 RF-coils
261, 500 NMR detection apparatus
262 storage unit
263, 513 switch unit
264 control unit
265 arithmetic processor
266 time base
267, 268, 269 via line
270 temperature sensor
271 pressure sensor
272 bypass line
273 switch
274 NMR data entering via line
275 pressure data via line
276 temperature data via line
350 single magnet
401 simple solenoid
402, 502, 504, 602, 604 confined area
403 flat coil
404 sensing area
405, 412 pole shoes
406, 413 magnetic flux source
407 yoke
408, 609 NMR detection apparatus
409 shell
410, 607 non-conducting pipe
411 wax
414 crude oil
416, 612 switch
501, 503 semitoroids
505 on-conducting pipe
510 crude oil
511 natural gas
512 non-magnetic ring
605 wet gas
606 water
607 non-conducting pipe
610, 611 rings
725 dashed line
726, 727 bi-exponential magnetization curve
727 longitudinal relaxation curve
830 magnetization curve
830 longitudinal relaxation curve
939 bi-exponential relaxation curve
939 transverse relaxation curve 940 dashed line of curve
1041 magnetization curve
1041 bi-exponential decay curve
1042 dashed line of curve
1101 RF-coil
1102 detection magnet
1103 pre-polarization magnet
1104 non-conductive and non-magnetic pipe
1105, 1106 valves
1107 pressure sensor
1108 temperature sensor
1109 storage unit
1110 arithmetic processor
1111 time base
1120, 1121 line
1112 NMR detection apparatus
1113 drain valve
1114 device
1115 valve
1116, 1117 two valves
1118 feed line
1119 line
1201 RF-coil
1202 detection magnet
1203 pre-polarization magnet
1204 non-magnetic pipe
1205, 1206 valves
1208 temperature sensor
1209 device
1210 storage unit
1211 arithmetic processor
1212 time base
1213 NMR detection apparatus
1214 heating device
1215 dashed line
1216, 1217 line

DETAILED DESCRIPTION OF THE PREFERRED EMBODIMENT

Hydrogen nuclei, which are abundant in substances like crude oil or water, have a magnetic moment due to the spin of the protons. If such nuclei are brought into an external magnetic field $B_0$ they align themselves along the field direction resulting in a net magnetization of the hydrogen containing material. The process which allows that kind of magnetization is called the longitudinal relaxation. In literature, the same process is also called thermal or spin-lattice relaxation. The rate at which the nuclei align themselves in the magnetic field in NMR is described by the longitudinal relaxation time $T_1$.

Another relaxation phenomenon of interest may be the transverse relaxation. After initial excitation of a sample of nuclei with a suitable oscillating magnetic field $B_1$, perpendicular to the field direction of the external magnetic field $B_0$, a magnetization transverse to the field direction of the external magnetic field $B_0$ results which decays after turning off the oscillating magnetic field $B_1$ due to the transverse relaxation effect. The process, again, is time consuming and the transverse relaxation time describes the rate at which this transverse magnetization is lost. In literature, the transverse relaxation time is also called the $T_2$-relaxation time.

Significant in this invention is the fact that both the longitudinal relaxation time $T_1$ and the transverse relaxation time $T_2$ are material specific constants and vary considerably for different materials. For example, the longitudinal relaxation time of hydrogen nuclei in oil is significantly shorter than the longitudinal relaxation time of hydrogen nuclei in water. Similar is true for the transverse relaxation time, where the transverse relaxation time of hydrogen nuclei in solids, such as wax or hydrates, is significantly shorter than the transverse relaxation time of hydrogen nuclei in liquids, such as oil or water.

If, for example, the longitudinal relaxation times of the individual components a multi-component mixture are different, a multi-exponential curve shape for the plot of longitudinal magnetization vs. time can be obtained. In such a curve, the total magnetization of the mix is always the sum of the magnetization of the individual components of the mix. It is possible to fit a multi-exponential curve to the data points and determine both the longitudinal relaxation times and the associated equilibrium magnetizations of the individual components.

The value of the equilibrium magnetization $M_0$ of an individual component, in turn, is determined by the number of spins such an individual component contributes to a multi-component mixture in a given reference volume. Hence, the measured equilibrium magnetization of an individual component is directly proportional to the volumetric concentration of the component in a given reference volume. (In this context, the reference volume is defined as the volume excited by an initial RF-pulse.)

However, the exact correlation between measured equilibrium magnetization and volumetric concentration can be different for different components and is generally not known. For example, more hydrogen is packed in pure oil, of a given volume, than in natural gas. This means, that for identical volumetric concentrations, the oil component will show a higher equilibrium magnetization than the natural gas component.

This complicates the step of determining the volumetric concentration of the components of a multi-component mixture, since measuring the equilibrium magnetizations of the individual components of a multi-component mixture with fixed volumetric concentrations of the components will not provide enough information to calculate the volumetric concentrations of the components. Instead, several relaxation curves of a multi-component mixture, where the volumetric concentrations of the components have been varied, will have to be analysed and correlated in order to yield the correct volumetric concentrations of the individual components.

Significant in this invention is the fact that such a necessary variation of the volumetric concentrations of a multi-component mixture can be achieved in three ways, namely a, b, and c:

a) use several NMR sensors and place them at different geometric positions of the process pipe, where the volumetric concentrations of the mixture components varies in each NMR sensor volume. This is the preferred way of achieving the desired variation of the volumetric concentrations of a multi-component mixture and will therefore be described first in detail.

b) Change the volumetric concentrations by removing or adding further material to the trapped mixture of interest.

c) Changing the phase equilibrium between the components by adjusting pressure and/or temperature of the trapped mixture of interest.

To achieve volumetric concentration variation according way a) an inclined process pipe is suggested to be used. The components of a multi-component mixture (e.g. an oil/water mixture) which has been enclosed between two valves and the inclined pipe section of the measurement apparatus will separate by gravity due to density differences. This generates a variation of the local oil/water ratio along an inclined pipe section. The heavier water will settle at the bottom, whereas the lighter oil will settle at the top of the inclined pipe section.

To measure the volumetric concentrations and the longitudinal relaxation times of the individual components of a multi-component mixture, the invention uses a combination of several NMR sensors arranged along the flow line and placed between two valves.

In one embodiment of this apparatus, the multi-component mixture is analysed by a group of NMR sensors having detection magnets of a magnetic field strength $B_0$. By carrying out a conventional inversion recovery experiment, the longitudinal relaxation curve of the material enclosed in the effective RF-field in one of the NMR sensors can be sampled. For example, a 90°-90° pulse sequence or, alternatively, a 180°-90° pulse sequence may be chosen for this purpose. In a 90°-90° pulse sequence, an initial 90°-pulse destroys the magnetization along the external magnetic field $B_0$ from which the material tries to recover, i.e. the material enclosed within the effective RF-field is being polarised again after the initial 90°-pulse. In other words, the nuclei of the individual components of the mixture re-align themselves along the field direction after the initial 90°-pulse. This is a time-consuming process and is governed by the longitudinal relaxation times of the individual components. With the second pulse, applied after a variable time $\tau$ (Tau), the re-gain of magnetization is measured by sampling the initial signal amplitude of the free induction decay (FID) following the second 90°-pulse.

It is possible to analyse the shape of the obtained longitudinal relaxation curve and determine the longitudinal relaxation times and the equilibrium magnetizations of the individual components with conventional curve fitting routines. However, the volumetric composition of the mix enclosed in the effective RF-field cannot be determined from a single longitudinal relaxation curve since the correlation between the calculated equilibrium magnetization and the volumetric concentration of the individual components in the reference volume very much depends on the materials examined, and generally is not known.

One possible way of determining the volumetric concentration of an individual component would be separating the mix and analysing the equilibrium magnetization $M_{100}$ of a pure component where the filling factor is 100%, i.e. only one component is enclosed in the effective RF-field of the NMR (or EMR) sensor. This is not very practical since mixes, such as oil/water, are very difficult to separate completely, in particular when the time for mixture separation is short.

Consider now the case where a fraction of a two-component flow has been trapped in an inclined measurement apparatus by means of two valves: If the mix is allowed to settle, there will be a variation of concentrations of the individual components along the pipeline. For example, for an oil/water mix the heavier water will concentrate in the bottom section of the pipe whereas the lighter oil will concentrate in the top section of the pipe. If the mix is analysed at two different positions by two NMR sensors in terms of longitudinal relaxation, the relaxation curves sampled at the two positions will be of different shape due to different composition of the mix. Consequently, the calculated equilibrium magnetizations of the individual components of the mixture will be different at these two positions. Together with the information that the sum of the volumetric concentrations of the individual components at both positions must add up to 100%, the measured equilibrium magnetizations of the individual components can be correlated in an advantageous manner yielding the volumetric concentrations of the individual components at both positions.

In an oil-water-gas mixture, each component will, to a certain extent, dissolve the other components and vice versa. For example, in crude oil production, crude oil dissolves gas at high pressure. If the pressure is lowered, gas will come out of solution increasing the volumetric gas fraction of the mixture and causing a shrinking of the oil fraction. The extent to which this will occur depends on the pressure and temperature such a mixture is exposed to. To ensure the measured data on volumetric concentrations and relaxation times of the individual components is comparable to the flow situation, pressure and temperature readings are taken while the trapped multi-component material is analysed in terms of NMR. After in-line fluid characterization at zero flow condition has been carried out, pressure and temperature are continued to measured for the oncoming process flow and compared against the pressure and temperature measured at zero flow condition to make sure all determined parameters such as relaxation times and hydrogen densities are still valid. In case there has been a significant shift detected for pressure and temperature during flow situation, the flow is shut down and in-line fluid characterization is repeated again.

An alternative way of determination of individual components is possible by analyzing the transverse relaxation curves of a multi-component mixture. By carrying out, for example, a Carr-Purcell-Meiboom-Gill-Sequence (also known as CPMG sequence), the decay of the transverse magnetization of a multi-component mixture over time can be monitored for liquids and gases. For a single component, such as water, this is a mono-exponential decay of the transverse magnetization over time. The rate at which this decay happens is governed by the $T_2$ relaxation time. For oil the $T_2$ relaxation time, in general, is significantly shorter than for water. For an oil/water mixture the transverse relaxation curve hence has a multi-exponential shape very similar to the longitudinal relaxation curves described before. The most obvious difference is that the curves are inverted. This is due to the measurement principle: for measuring the transverse relaxation of material of interest, its loss of transverse magnetization over measurement time is measured, whereas for measuring the longitudinal relaxation the gain of longitudinal magnetization over measurement time is measured.

As set out before for the longitudinal relaxation measurements: it is not possible to obtain the volumetric content of the individual components of a multi-component mixture directly by analyzing the multi-exponential transverse relaxation curves since the hydrogen density (or hydrogen index) of the individual components is not known. If the concentration of the multi-component mixture is varied for several measurements (by using gravity-based separation in an inclined process pipe carrying the entrapped mixture), it is possible to sample these curves with multiple NMR sensors located at different positions.

The sampling of transverse relaxation curves is not necessarily limited to liquids and gases. It can also be applied to solid materials. In the oil and gas production, for example, hydrate and wax (if conditions are right) can form inside the process pipe. Since these substances can block the process pipe and in worst case lead to a loss of the production well, it is of vital interest to any operator to receive an early warning if such an event occurs.

The transverse relaxation times of solids are more than three magnitudes shorter than those of liquids and thus can be easily distinguished from liquids and gases. Detecting the NMR signal of solids, however, takes careful design of the NMR electronic circuitry. The details of such a design are not dealt with in depth in here, since there is plenty of literature on this available. For the purpose of this disclosure, however, some relevant aspects are covered briefly.

In pulsed NMR, signal generation is based on the application of a short burst of electromagnetic waves in the radio frequency (RF) range. These radio waves are transmitted into a sensor which consists mainly of the RF-coil attached to a capacitor to form, with a few other electronic components; a tank circuit tuned the operation frequency of the NMR measurement device.

After the power transmitter connected to the NMR sensor has generated a burst of radio waves and has been switched off, it takes a while before the electromagnetic energy of the burst has settled in the tank circuit to such low levels that a receiver connected to the RF-coil can be turned on without being overloaded (in literature this is also referred to as ringdown time). This is the so-called dead time of the RF-coil which needs to elapse before the NMR signal of the excited nuclei can be sampled.

When hydrogen contained in solid material is excited by means of pulsed NMR, a part of the transverse relaxation is lost during the dead time of the receiver as the transverse magnetization decays rapidly due to the short transverse relaxation time $T_2$ (which is in the range of microseconds). When sampling the NMR signal of liquid or gaseous material placed in a static magnetic field of poor field homogeneity, similarly, a part of the transverse magnetization is also lost during the dead time as the transverse magnetization decays rapidly due to the poor field homogeneity of the static magnetic field. It is for these reasons important to sample the NMR signal with minimum losses and to keep the dead time of the RF-coil as short as possible.

One way of keeping dead times short is using active feedback schemes as suggested by Emmanuel Baudin, Kayum Safiullin, Steven Morgan, Pierre-Jean Nacher: "An active feedback scheme for low field NMR experiments", JCNS Workshop on Modern Trends in Production and Applications of Polarized 3He, July 2010, Ismaning, Germany. pp. 012009, 10.1088/1742-6596/294/1/012009.hal-00562609. In such schemes the damping coefficient of the tank circuit is varied during the NMR pulse excitation experiment. After the excitation pulse, a high damping coefficient is applied to shorten the dead time. Before the NMR signal receiver is enabled, a low damping coefficient is applied to get a strong NMR signal to be picked up in the receiver unit.

Another way of keeping dead times in pulsed NMR short is to keep the overall amount of energy in the tank circuitry of the NMR sensor low. This can be accomplished by using small RF-coils which have a magnetic field of small volume. As the magnetic field is of small volume, only small amounts of energy are stored in the magnetic field. One particularly beneficial way implementing that is to use remote sensing coils. In traditional NMR, the material to be measured is placed inside the NMR sensor coil. In this disclosure it is proposed to place the material to be measured outside the NMR sensor coil. Planar coils, solenoids or semitoroids may be used for this purpose. Further information can be found in: R. A. Assink, Eiichi Fukushima, A. A. V. Gibson, Alan R. Rath and Stephen B. W. Roeder in "A Nondetuning Surface Coil, the Semitoroid", Journal of Magnetic Resonance 66, pp. 176-181 (1986). With such remote sensing RF-coils, the pipe diameter of the process pipe poses no longer a restriction to how small the NMR sensor coils can be made.

Another beneficial aspect of using remote sensing coils for the detection of solids is that solids tend to cling to the pipe wall, i.e. close to the region of the remote sensing RF-coils. Even a small absolute volumetric percentage of solids in the cross-section of the pipe results in a relatively large percentage of solids encountered in the sensing zone of the remote sensing RF-coil. This provides a convenient means of varying the volumetric concentration of the individual components of a multi-component mixture when a gravity-based separation in an inclined process pipe is not really practical. Having large variations of the concentration of solids in the multi-component mixture is helpful for determining the volumetric share of solids with good accuracy.

Yet another beneficial aspect of using remote sensing coils for the detection of solids is that the requirement on the field homogeneity of the static magnetic field $B_0$ is easier to meet. It is relatively difficult to achieve a very homogeneous magnetic field over a large volume fraction. Especially yokeless magnets which cannot make use of soft iron pole shoe plates to smooth out field inhomogeneity, suffer from poor field homogeneity.

By applying remote sensing RF-coils, which only use a much smaller volume fraction of the magnetic field $B_0$ in pulsed NMR, it is still possible to generate a NMR signal with a reasonably narrow bandwidth. The relative field homogeneity in such a confined area is much better compared to the large area that is covered by a conventional RF-coil, wound around the process pipe of the apparatus. In this latter case, the whole cross-section of the process pipe needs to have a very homogeneous field $B_0$ for NMR measurements.

If there is only one NMR sensor available for analyzing the entrapped multi-component mixture, way a) to achieve volumetric concentration variation is not possible. In such a case, the variation of the volumetric concentration of a mixture can be achieved by adding or removing constituents of the mixture (which is referred to as way b). This can be accomplished with a venting valve which discharges to a low pressure environment or alternatively or in addition with a feed line, which connects to a high pressure part upstream of a process pipe. Relying on a venting valve only requires the presence of a gaseous fraction in the measurement volume of interest, since liquids, in general, are not compressible. If only liquids are present as mixture components, it is necessary to have both, a possibility for venting and feeding material in, in order to alter the mixture composition.

Signal generation in way b) is done the same way as described for way a). That means longitudinal or transverse relaxation curves are sampled for each specific mixture composition and analysed with a curve fitting routine. The only difference is that between the sampling of the relaxation curve, constituents of the mixture have to be added or removed to change the volumetric concentration for the components of the mixture. The obtained multi-exponential signal curves will then yield different equilibrium magnetizations for the individual components of the mixture. These equilibrium magnetizations can be cross-correlated the same way as described for way a).

If one of the mixture component consists of a compressible hydrogen bearing matter, such as methane, the hydrogen density of this substances does not remain constant between the different measurements. The only modification required to analyse the NMR signal correctly then is to measure pressure and temperature of the gas fraction in addition. If some crude oil, e.g., is fed to an entrapped crude oil and methane mixture, the pressure of the mixture will increase and change the hydrogen density of the methane fraction. According Avogadro's law, the density of gases is temperature T and pressure P dependent. If both parameters P and T are measured and logged in addition to each NMR measurement, it is possible to normalize the measured equilibrium magnetization of the methane fraction and cross-correlate it in the same manner as described for way a).

Another way to achieve volumetric concentration variation is to make use of the phase equilibrium of a multi-component mixture according way c). All phases of a multi-component mixture are to a certain extent soluble in each other. For example, in crude oil production well head production can be a mixture of oil and gas where the gas mainly consists of methane. The amount of methane the crude oil can dissolve is determined by the temperature and pressure of the mixture. Further details on this phenomenon can be found in the publication Experimental Study and Numerical Simulation of Methane Solubility in Crude Oil for Gas Injection Enhanced Oil Recovery, by Mohammad Reza Ghulami, Kyuro Sasaki, and Yuichi Sugai, Department of Earth Resources Engineering, Graduate School of Engineering, Kyushu University, Japan, 4th World Conference on Applied Sciences, Engineering & Technology, 24-26 Oct. 2015, Kumamoto University, Japan. Essential for this disclosure is that the amount of methane dissolved in the crude oil changes, if the temperature and/or the pressure of the mixture is changed. For example, if the mixture is pressurized, some of the gaseous methane will be dissolved in the crude oil causing a swelling of the crude oil fraction and a shrinking of the gaseous methane fraction. In this example, the volumetric concentration of the gaseous methane fraction would be reduced by increasing pressure of the mixture.

Another example for modifying the volumetric concentration of components by temperature variation would be heating a mixture of oil and wax above its pour point. By carefully heating up the oil and wax enclosed inside the measurement apparatus, the wax content can be decreased in a controlled manner for the purposes of the disclosed invention. Another similar example would be a mixture of natural gas and hydrates which also can occur in hydrocarbon production lines. Heating up would in this example decrease the amount hydrates present in the mixture.

However, it is not essential to have an active device changing the pressure and temperature setting of the enclosed mixture of interest, such as a pressure cell or an electrical heating or cooling device. In hydrocarbon production, the temperature of the well head production is generally above ambient temperature. So any multiphase flowmeter experiences operating temperatures above ambient temperature. If such a NMR multiphase flow meter (or to be more precise multi-component flow meter) is isolated from the process flow line for in-line fluid characterization, just letting the entrapped mixture cool off leads to a change in the volumetric concentrations of a crude oil and gas mix. Only the monitoring of pressure and temperature with appropriate measurement devices is required when carrying out in-line fluid characterization. So by just letting the entrapped mixture cool off, relaxation times, hydrogen density and volumetric concentrations of the individual components of the enclosed fluid mixture can be determined.

Attention is first directed to FIG. 1 of the drawings, showing the flow metering apparatus of U.S. Pat. No. 5,684,399, which is considered as state of the art for NMR flow metering.

Figure 2:
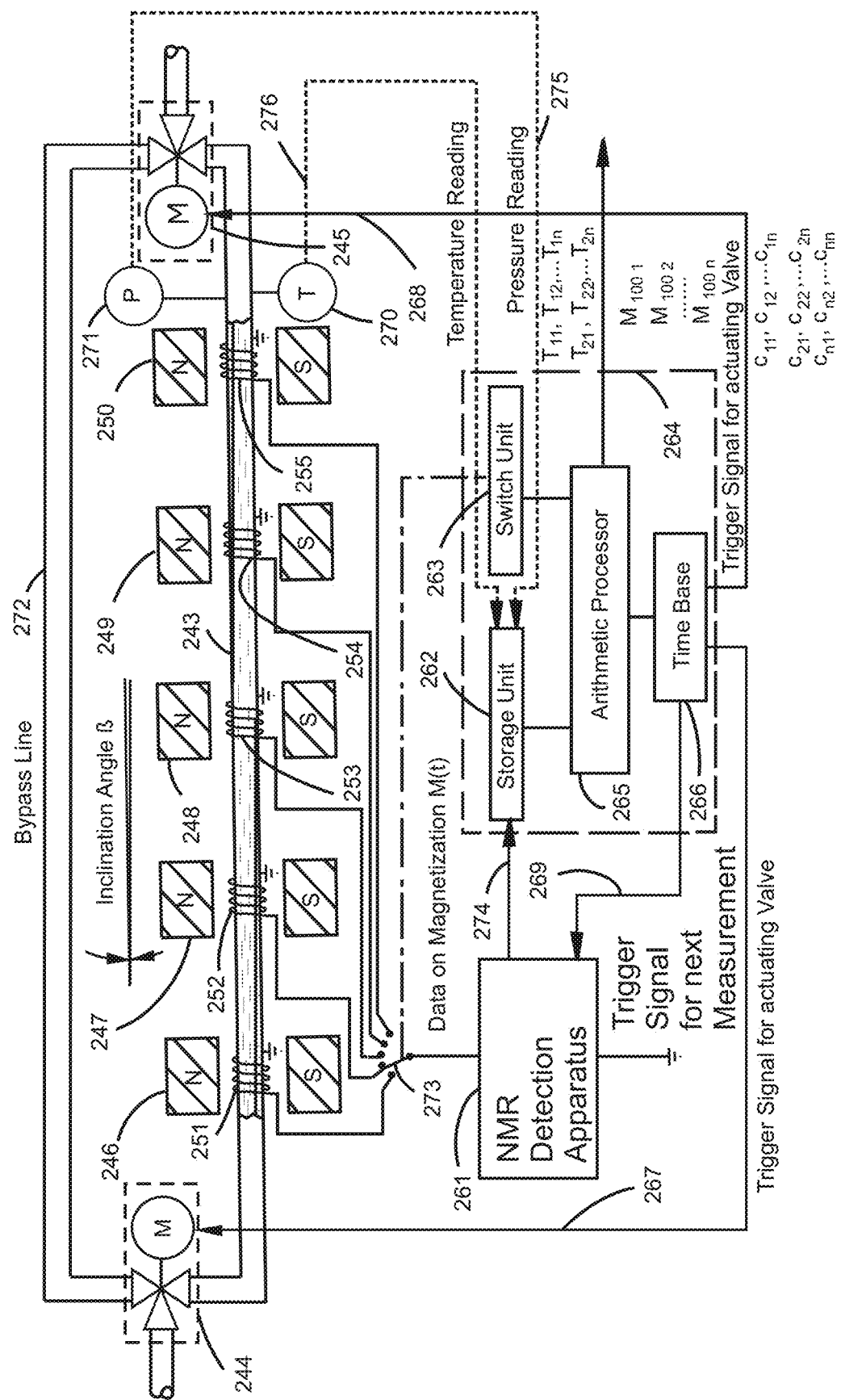
FIG. 2 is a modification of the apparatus shown in FIG. 1 to measure the longitudinal and transverse relaxation times, hydrogen densities and the volumetric concentrations of the individual components of an entrapped multi-component mixture. It has been supplemented with pressure and temperature sensor, valves and a bypass line. The polarizing magnets 100, 102, 104, 106, 108 and 110 of FIG. 1 have been omitted since they do not have any function when in-line characterization of the fluid is carried out. The detection magnets 101, 103, 105, 107 and 109 of FIG. 1 are shown without a variation of the air gap since magnetic field gradients are not required for in-line characterization of the fluid.

Attention is next directed to FIG. 2 of the drawings which is a modification of the apparatus of FIG. 1. In FIG. 2, the numeral 243 identifies a pipe or conduit which carries a multi-component mixture. At this portion, the pipe 243 has some material in it, the material typically being a mixture of oil, water and gas. The pipe 243 is inclined by an angle β (beta) towards its horizontal position. The angle is subject to pipe length and composition of the mixture enclosed in the pipe. For a pipe with a length of 6000 mm carrying an oil/water/gas mix, an inclination angle of 1° may suffice. Alternatively, the apparatus also may be inclined up to an angle of 90° giving a vertical orientation of the pipe. The apparatus of FIG. 2 is shown with 5 RF-coils for explanation purposes. With such a multi-coil design it is possible to pick such a pair of RF-coils for the disclosed invention, where only two components of the entrapped mixture are enclosed inside the effective sensor volume of the chosen two RF-coils and each RF-coil having a mixture of the two components with different volumetric concentration inside its sensitive volume. This design feature is very useful if the mixture consists of more than two components, and all components are to be characterized in terms of their NMR properties with high accuracy. Such a method also saves time for in-line fluid characterization, since relaxation curves can be sampled with less data points. This shortens measurement time in particular when carrying out longitudinal relaxation measurements.

The portion of the pipeline shown in FIG. 2 is made of non-magnetic material so that lines of magnetic flux can pass through the pipe 243. At both ends of the pipe two valves 244 and 245 are fitted. When the apparatus is not analysing the material of the flow, these valves are open for pipe 243, so that the flowing material can pass through. When the longitudinal and transverse relaxation times and the volumetric concentrations of the individual components of the flow are to be measured, these valves are quickly closed trapping a segment of interest in the pipe 243. In this example, the valves 244 and 245 are three-way valves to route the oncoming process flow around the measurement apparatus via a bypass line 272 while measurements are being carried out. When the measurements have been completed, the bypass line 272 is de-activated by opening the valves 244 and 245 for pipe 243 again. Other configurations for the bypass are possible as well, but not illustrated further.

Due to different densities of the individual components, the mixture trapped in pipe section 243 separates by natural gravity. As the whole apparatus is inclined, the separation generates a local variation of the mixture composition along pipe 243. For example, the heavier water component of an oil/water mix will concentrate at the lower section of pipe 243, whereas the lighter oil component of the mix will concentrate in middle section of pipe 243. The gas component of the mix will concentrate in the upper section of pipe 243. This local variation of the composition of the mixture is used for the measurements. After the measurements have been executed, the valves 244 and 245 are opened for pipe 243 again, so that the flowing material may pass through again.

The pipe 243 is placed in a magnet arrangement consisting of several detection magnets 246, 247, 248, 249 and 250. The magnets 246, 247, 248, 249 and 250 impose a static magnetic field $B_0$ on the enclosed mixture. In the centre of the detection magnets 246, 247, 248, 249 and 250, several RF-coils 251, 252, 253, 254 and 255 are wound concentrically around the pipe 243 to generate oscillating magnetic fields at right angles to the external magnetic field B0.

The coils 251, 252, 253, 254 and 255 are connected via a switch 273 to a NMR detection apparatus 261 and form, together with the detection magnets 246, 247, 248, 249 and 250, several NMR sensors. The NMR detection apparatus 261 is connected to a control unit 264 which controls the function of the NMR detection apparatus 261. Control unit 264 is also connected to the valves 244 and 245 to actuate them by sending trigger signals for opening and closing access to pipe 243. Important for all the following considerations is that the NMR sensor sensitivity is adjusted for each individual sensor such that the NMR signal strength measured in the NMR detection apparatus 261 for a reference material of fixed hydrogen density, such as water, is the same, regardless whether the reference material has been measured in the coils 251, 252, 253, 254 or 255. This allows readings of the magnetization to be correlated in an advantageous manner.

Attention is now directed to the control unit 264 of the apparatus of FIG. 2. The control unit 264 controls all actuators of the apparatus, such as valve 244 via line 267, valve 245 via line 268, NMR detection apparatus 261 via line 269 and processes all NMR data entering via line 274, pressure data via line 275 and temperature data via line 276. The control unit 264 comprises for this purpose a storage unit 262, a switch unit 263, an arithmetic processor 265 and a time base 266.

In an arrangement of several NMR sensors, generally, there is the possibility of signal interference between the RF-coils of the NMR sensors. Depending on the design, they are located close to each other. There is a risk of transmitting signals from one coil to the neighbouring coils and vice versa. If the coils are long and have many turns, the risk of coil interference is increased. An interlaced operation is preferable to avoid direct coupling between the coils. Principally, following conditions must be met:

When the transmitter of the NMR Detection Apparatus 261 is on to power one of the RF-coils (e.g. coil 252), all other coils (251, 253, 254 and 255) are disconnected.

The receiver of the NMR Detection Apparatus 261 can only be on if the transmitter is off to prevent any overload of the receiver unit.

In practice, for the operation of the apparatus, following measurement procedure is suggested:

The control unit 264 with time base 266 sends a trigger signal to the NMR Detection Apparatus 261 via conductor 269. The NMR Detection Apparatus 261 starts measuring by turning on its transmitter and irradiating the substance enclosed in the RF-coil 252 with one or several RF-pulses (e.g. a 90°-90° pulse sequence). The RF-pulses are ended by turning off the transmitter after the pulse time (usually a couple of µs). After some dead time has elapsed, the receiver of NMR Detection Apparatus 261 is enabled, and the following NMR signal response is picked up in RF-coil 252. Then the sampled NMR signal data is transferred to the storage unit 262 of control unit 264 via line 274. As soon as the pulse sequence has been completed in RF-coil 252, the switch unit 263 sets switch 273 to the next position in order to connect to the next RF-coil (e.g. 253). Control unit 264 triggers then the next RF-coil 253 for measurement, and so on.

The sampled data picked up in the RF-coils 251, 252, 253, 254 and 255 is stored in storage unit 262 and can be accessed by the arithmetic processor 265 for data evaluation. It calculates the longitudinal relaxation times $T_{11}, T_{12}, \ldots, T_{1n}$ of n individual components of the multi-component mix. Instead of the measurement of longitudinal relaxation behaviour mixture it also possible to measure the transverse relaxation behaviour of the mixture. In such case a set of transverse relaxation times $T_{21}, T_{22}, \ldots, T_{2n}$ of n individual components of the multi-component mix is yielded.

In addition, the calculation also yields the equilibrium magnetizations $M_{1001}, M_{1002}, \ldots, M_{100\,n}$ of the individual components when they are pure, i.e. they share 100% of the sensor volume in each of depicted set of RF-coils 251, 252, 253, 254 and 255. These equilibrium magnetization sensor data represent the relative hydrogen density for each individual component. With these equilibrium magnetizations, as will be shown later, the volumetric concentrations $c_{11}, c_{12}, \ldots, c_{1n}, c_{21}, c_{22}, \ldots, c_{2n} \ldots, c_{n1}, c_{n2}, \ldots, c_{nn}$ of n individual components, present at n different locations in depicted set of RF-coils (251, 252, 253, 254 and 255 in this example) are computed.

Oil, water and gas dissolve each other to a certain extent in phase equilibrium. The mutual solubility, in turn, depends on pressure and temperature of the mixture. During the in-line fluid characterization by means of described NMR measurements, therefore, pressure and temperature readings are carried out simultaneously by the temperature sensor 270 and the pressure sensor 271 and transferred to storage unit 262 via lines 275 and 276. With a digital model of the phase equilibrium behaviour of the mixture, this allows to predict volumetric changes of the mixture composition (for example a shrinking of the oil fraction), should the pressure of the mixture be reduced in the process line. Ideally, however, the pressure and temperature of the mixture enclosed in pipe section 243 is kept similar to the flow situation (i.e. where valves 244 and 255 have opened to let the mixture flow through pipe section 243 again, after in-line fluid characterization has been completed). In such a flow situation, the mentioned shrinking of the oil fraction will be minimal. If pressure and temperature of the material flowing through the apparatus are continuously measured and stored, it can be detected if pressure and/or temperature significantly drift away over time from the reference values measured, when in-line fluid characterization has been carried out. In case of detecting a significant drift, the apparatus closes valves 244 and 245 to trap some of the flowing material inside pipe 243 again und repeats the in-line fluid characterization under changed pressure and/or temperature levels.

Figure 3:
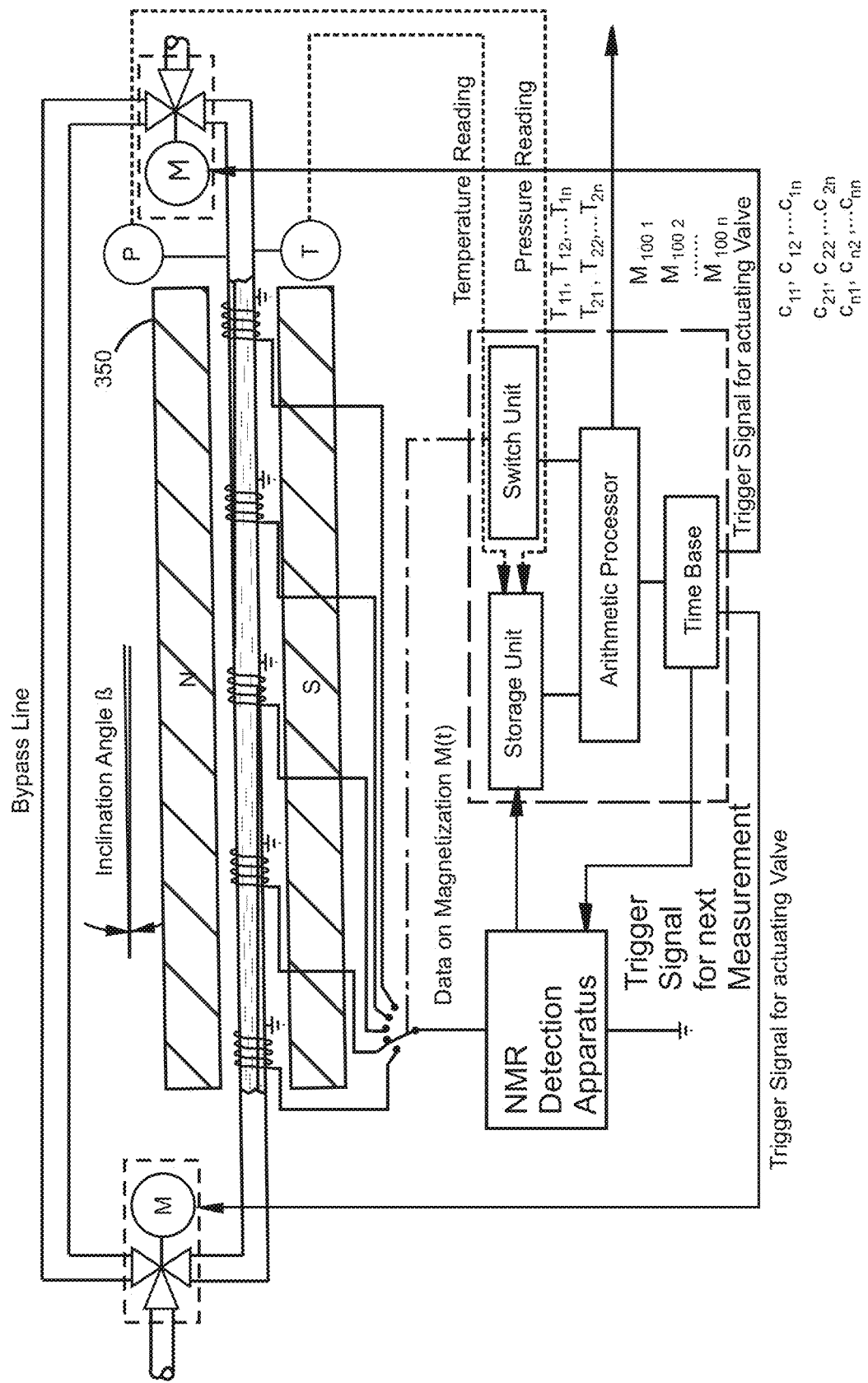
FIG. 3 is a modification of the apparatus shown in FIG. 2 where the multitude of magnets has been replaced by one common magnet.

Attention is now directed to FIG. 3 of the drawings which shows a modification of the apparatus as depicted in FIG. 2. In FIG. 3 the multitude of magnets, which generate the static magnetic fields $B_0$ required for pulsed NMR are substituted with a single magnet 350 serving the very same purpose.

Figure 4:
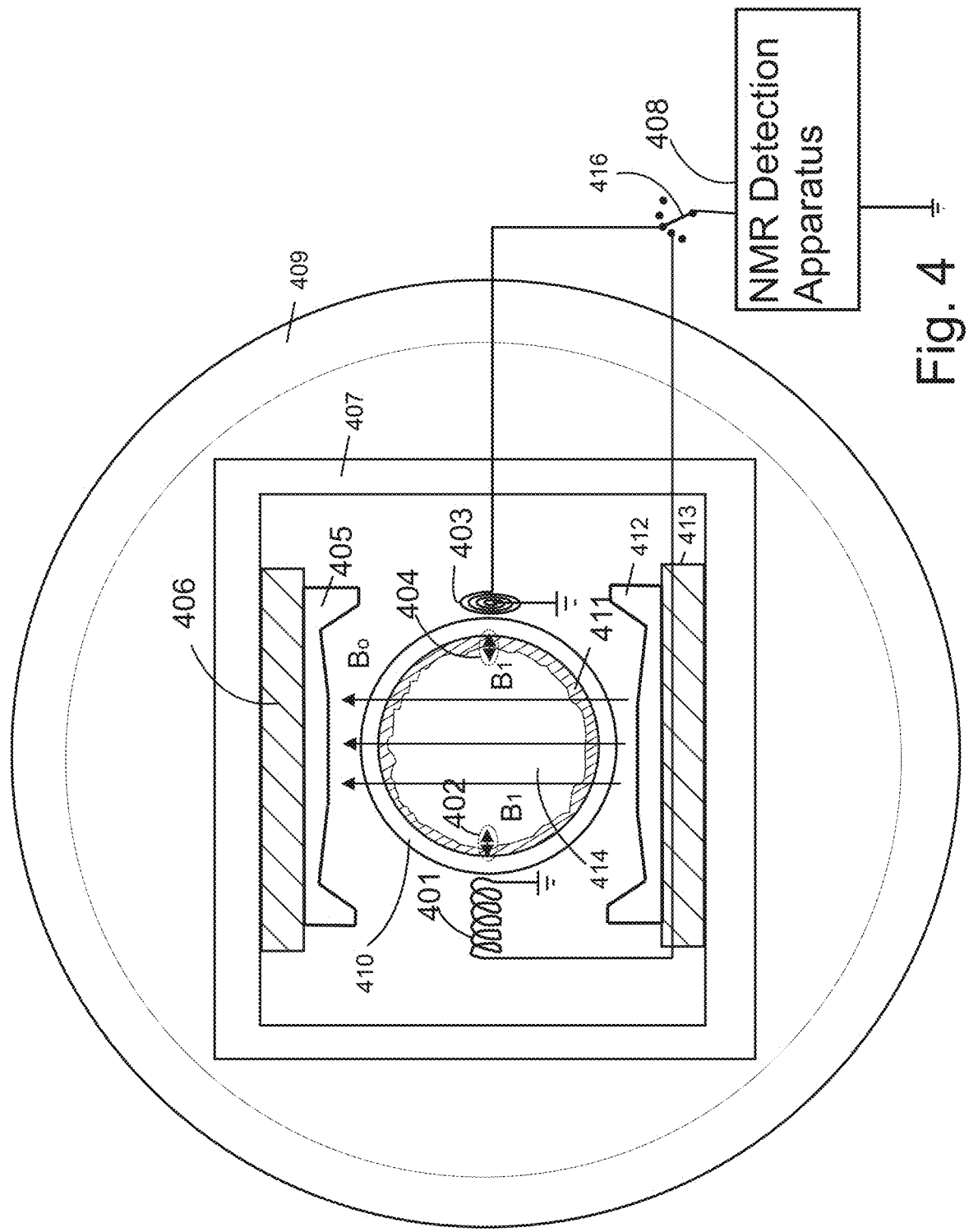
FIG. 4 shows the cross-section of the apparatus of FIG. 3 based on the use of permanent magnets with pole shoes and a yoke geared towards achieving a homogenous permanent magnetic field $B_0$ inside the air gap. The apparatus is modified for the detection of solids by means of remote sensing solenoid and surface RF-coils, where the sample is not contained inside the RF-coil as in traditional NMR.

Attention is now directed to FIG. 4 of the drawings which shows a cross-sectional view of the invented apparatus. In this view, a conventional magnet system can be seen consisting of a magnetic flux source 406 and 413 (AlNiCo permanent magnets, for example), pole shoes 405 and 412 (preferably made of soft iron) and a yoke 407 to distribute the magnetic flux. Inside the air gap of this magnet a non-magnetic and electrically non-conducting pipe 410 is placed which contains the material of interest. In this example, the material of interest is crude oil 414 with wax 411 deposited on the pipe wall. This material is examined by means of remote sensing coils. The remote sensing coil can be, for example, a simple solenoid 401 placed outside the pipe to be connected to a NMR detection apparatus 408 via a switch 416. When a NMR pulse experiment is carried out, the spins excited and measured are within a confined area 402 of the total pipe cross-section representing only a fraction of it.

Solid components in a multi-component flow, such as wax, tend to deposit on the pipe walls giving an uneven geometric distribution across the pipe cross-section. In order to measure the buildup of wax scale on the pipe walls of crude oil production lines more accurately in its early stage, it is advantageous to restrict the effective RF-field of the coil to a region, where the local volumetric concentration of wax is particularly high increasing the NMR signal coming from the solid material against the NMR signal coming from the liquid signal. The remote sensing coil can alternatively also be a flat coil 403 with a similarly confined sensing area 404 as shown at the right side of pipe 410. The whole apparatus is contained in a shell 409 designed to withstand the water pressure when placed at subsea level.

Figure 5:
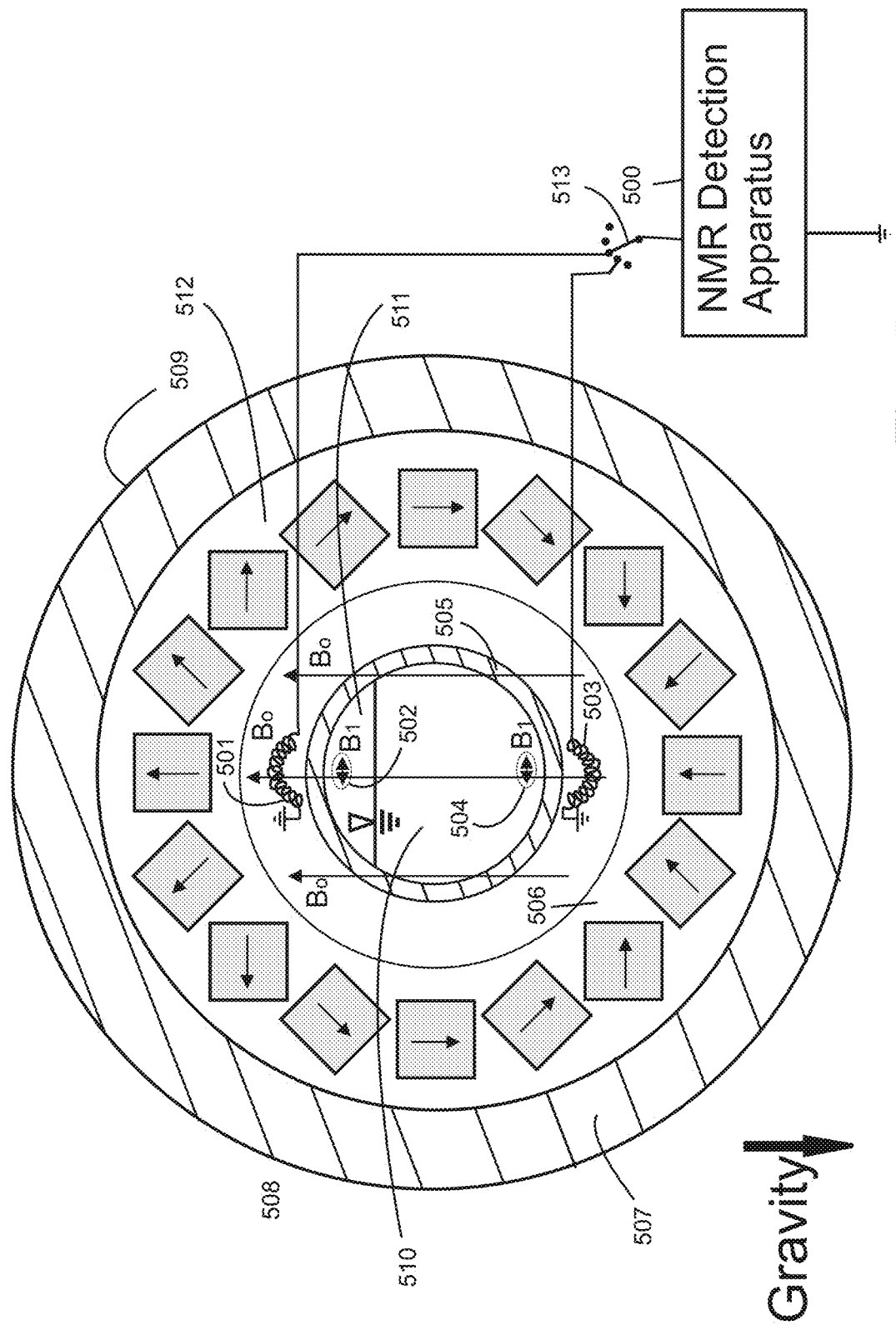
FIG. 5 shows the cross-section of the apparatus of FIG. 3 based on a yokeless magnet design, also known as Halbach Array. It is modified for the detection of small fractions of gas and the bulk of the mixture being liquid. It utilizes remote sensing semi-toroidal RF-coils, where the sample is not contained inside the RF-coil as in traditional NMR.

Attention is now directed to FIG. 5 of the drawings which shows the cross-section of a yokeless magnet system as an alternative design. Such a magnet system relies on a magnetic material which is transparent to the flux, e.g. NdFeB magnets. In this example, sixteen magnetic cubes of the same field strength are placed inside a non-magnetic ring 512, forming a so-called Halbach Array. Their field orientation is indicated by arrows as depicted in FIG. 5. Such a design yields a homogeneous static magnetic field $B_0$ inside the center of ring 512. Inside the ring 512 a non-magnetic and electrically non-conducting pipe 505 is placed which contains the material of interest. In this example, the material of interest is crude oil 510 with natural gas 511 on top of it. This material is examined by means of remote sensing coils. In this example, the remote sensing coils are semitoroids 501 and 503, placed outside the pipe 505, and connected to a NMR detection apparatus 500 via a switch 513. When a NMR pulse experiment is carried out, the spins excited and measured are within a confined area 502 and 504 of the total pipe cross-section. Again, the whole apparatus is contained in a shell 509 designed to withstand the water pressure when placed at subsea level.

Figure 6:
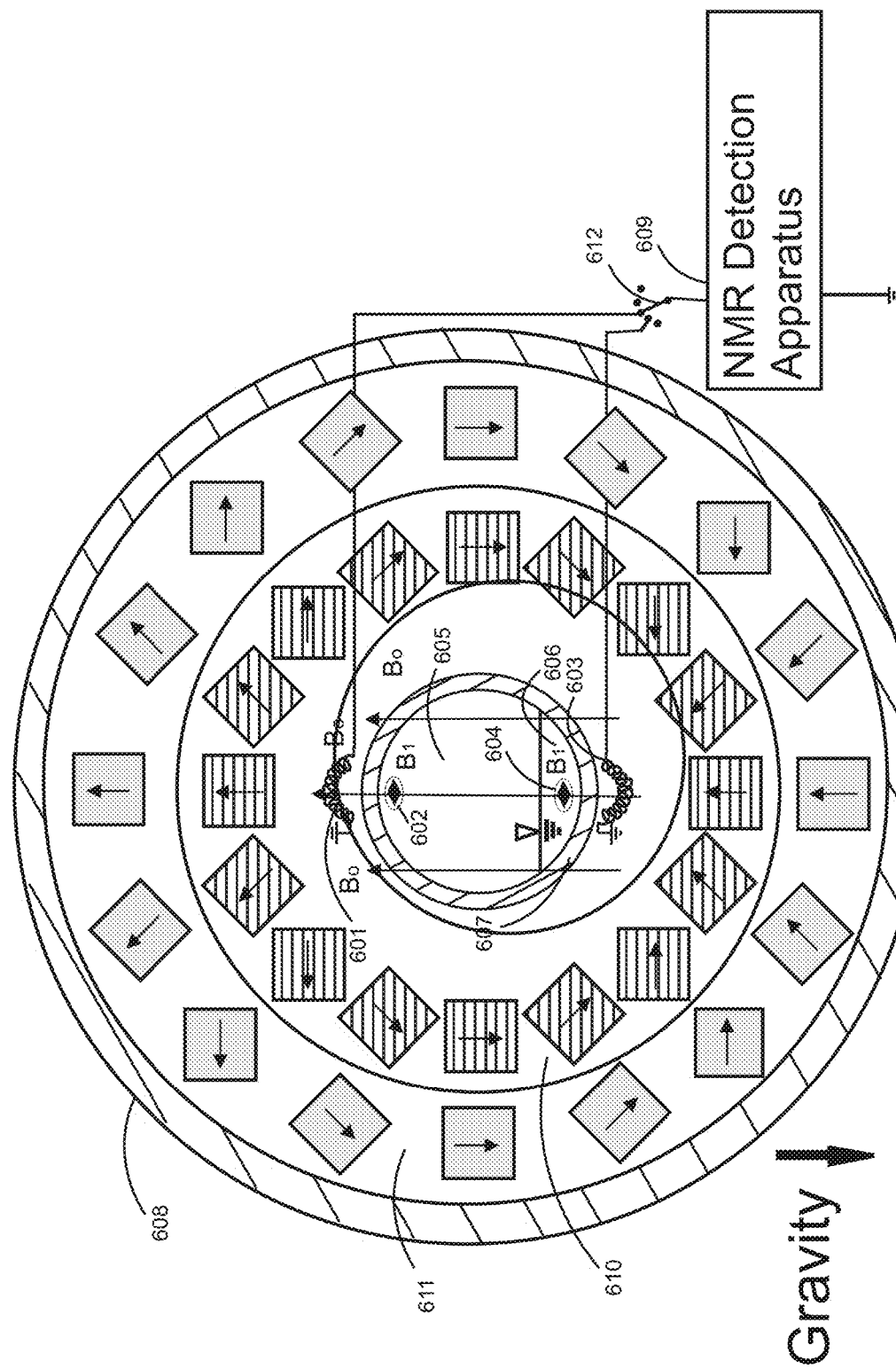
FIG. 6 shows the cross-section of the apparatus of FIG. 3 based on a yokeless magnet design with two concentric Halbach Arrays. It is an alternative to FIG. 5. The fields of the two Halbach Arrays superimpose upon each other and increase the magnetic field strength $B_0$ which is advantageous for the detection of gases with low hydrogen density. The apparatus of FIG. 6 is modified for the detection of small fractions of liquid where the bulk of the mixture is gaseous. Remote sensing semi-toroidal RF-coils again, are utilized for this purpose.

Attention is now directed to FIG. 6 of the drawings which shows a modified version of the apparatus of FIG. 5 where the magnet system consists of two instead of one Halbach arrays nested in each other. The magnetic fields of the rings 610 and 611 superimpose on each other generating a particularly strong magnetic field $B_0$ inside its center.

Inside the rings 610 and 611 a non-magnetic and electrically non-conducting pipe 607 is placed which contains the material of interest. In this example, the material of interest is wet gas 605 with water 606 collecting at the bottom. This material is examined by means of remote sensing coils. Again, the remote sensing coils are semi-toroids 601 and 603, placed outside the pipe, and connected to a NMR detection apparatus 609 via a switch 612. When a NMR pulse experiment is carried out, the spins excited and measured are within a confined area 602 and 604 of the total pipe cross-section. Again, the whole apparatus is contained in a shell 608 designed to protect the apparatus against the environment it operates in.

Figure 7:
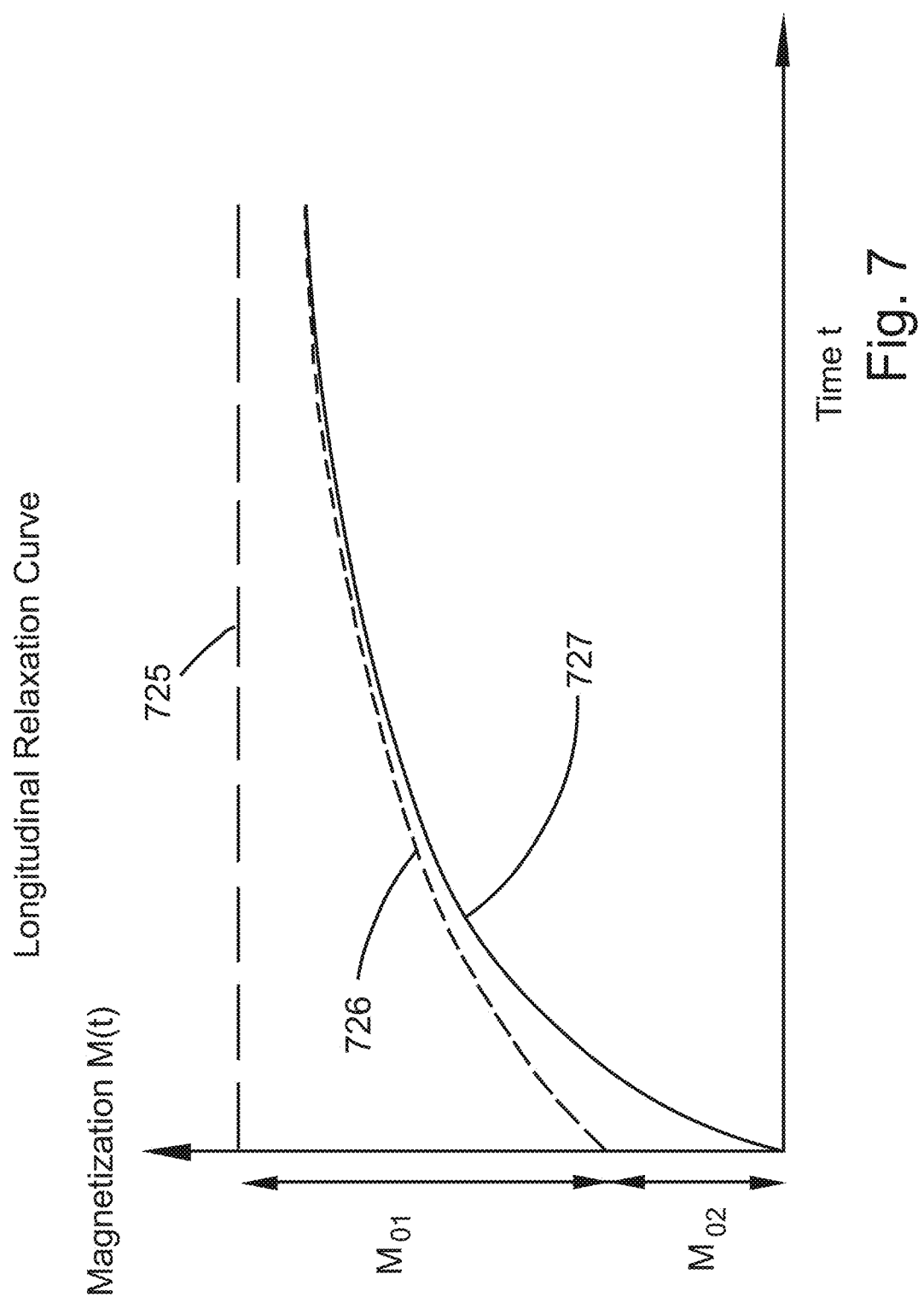
FIG. 7 shows a multi-exponential longitudinal relaxation curve sampled with the NMR sensor at position 252 of FIG. 2.

Attention is now directed to FIG. 7 of the drawings which qualitatively illustrates the longitudinal relaxation curve yielded by a conventional inversion recovery experiment, such as a 90°-90° pulse sequence, in a linear plot of NMR signal amplitude vs. time. FIG. 7 plots the measured magnetization M(t) of the material enclosed in the RF-coil 251 of FIG. 2 against time t. As the material consists of two components with substantially different longitudinal relaxation times $T_{11}$ for component 1 and $T_{12}$ for component 2, the magnetization processes of both components happen at different rates. For example, the materials of interest may be water (which may be referred to as component 1) and oil (which may be referred to as component 2). Oil has a significantly shorter longitudinal relaxation time than water. In a 90°-90° pulse sequence, the magnetization processes of both components superimpose on each other and a bi-exponential magnetization curve 727 is yielded. It is possible to analyse the shape of the curve and determine, for example, the contribution of component 1 to the total magnetization M(t). Curve 726 in FIG. 7 shows how component 1 tries to reach towards the equilibrium magnetization of both components, depicted as dashed line 725 in FIG. 7. Curve 726 shows that component 1 is gaining its magnetization at a much slower rate than component 2. The exact shape of the curve 727 can be described with following first equation:

$$M(t)=M_{01}(1-e^{t/T_{11}})+M_{02}(1-e^{t/T_{12}})$$

where $M_{01}$ is the equilibrium magnetization of component 1, t the time, $T_{11}$ the longitudinal relaxation time of component 1, $M_{02}$ the equilibrium magnetization of component 2 and $T_{12}$ the longitudinal relaxation time of component 2.

It is possible to perform a fit for curve 727 and calculate the contribution of the individual components to the total magnetization if enough data points for curve 727 exist. In other words, the equilibrium magnetizations $M_{01}$, $M_{02}$ and the longitudinal relaxation times $T_{11}$, $T_{12}$ of both components can be obtained by analysing the exact shape of curve 727.

Figure 8:
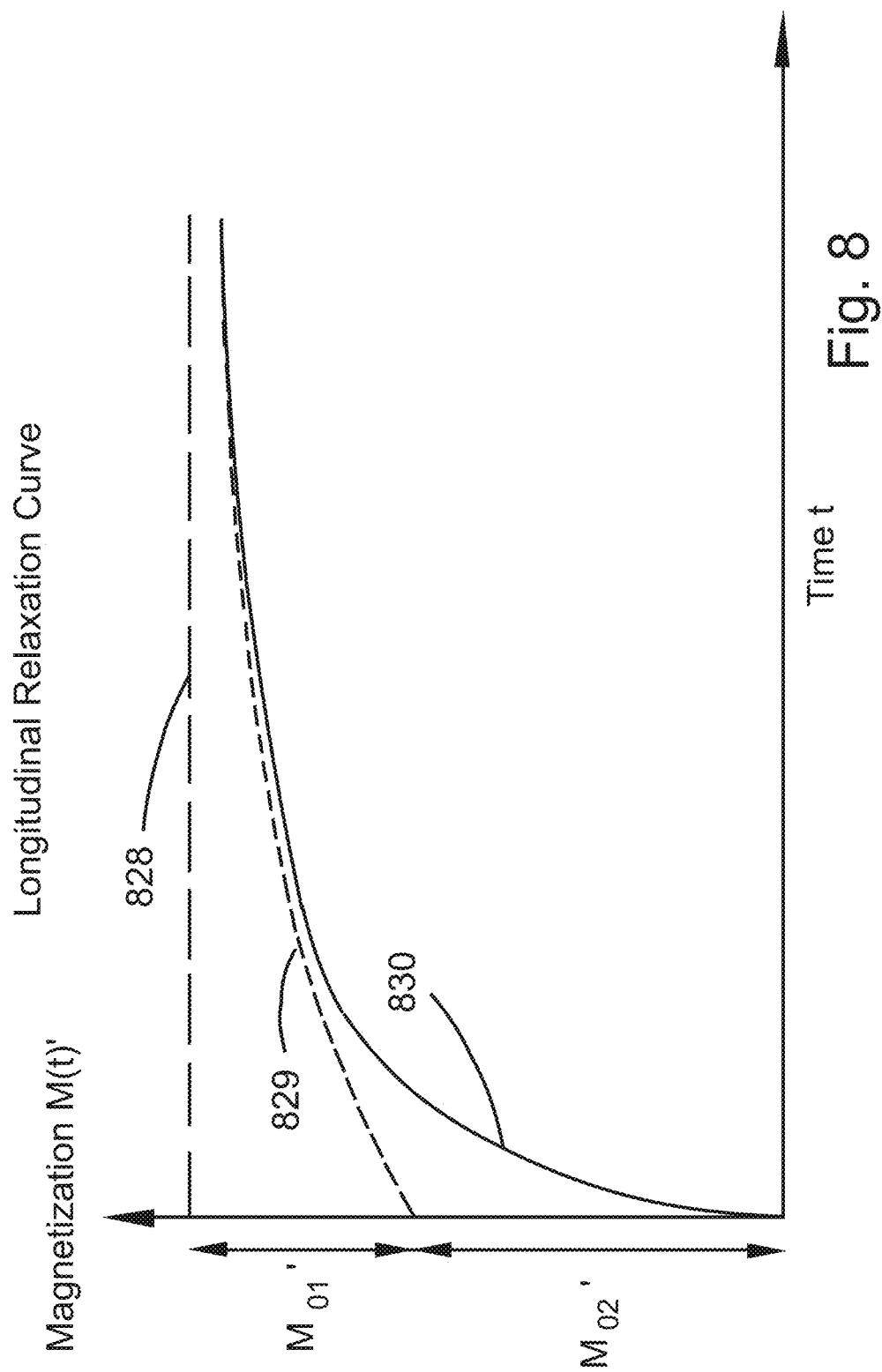
FIG. 8 shows a multi-exponential longitudinal relaxation curve sampled with the NMR sensor at position 251 of FIG. 2.

Attention is next drawn to FIG. 8 of the drawings which plots the magnetization M(t)' of the material enclosed in the RF-coil 252 of FIG. 2 against time t, in a linear plot. Again, FIG. 8 qualitatively illustrates the longitudinal relaxation curves yielded by a conventional inversion recovery experiment, such as a 90°-90° pulse sequence. The only difference to FIG. 7 is that the volumetric concentrations of the components 1 and 2 enclosed in the effective RF-field of coil 252 of FIG. 2 are different to the volumetric concentrations found in the effective RF-field of coil 251 of FIG. 2. Though the components 1 and 2 are identical to those of FIG. 7 and have identical longitudinal relaxation times $T_{11}$ and $T_{12}$, the shape of the magnetization curve 830 of FIG. 8 is different due to different composition of the mix enclosed in the effective RF-field of coil 252 of FIG. 2. Again, as the material consists of two components with substantially different longitudinal relaxation times $T_{11}$ for component 1 and $T_{12}$ for component 2, the magnetization processes of both components happen at different rates. Curve 829 in FIG. 8 shows how component 1 tries to reach towards the equilibrium magnetization of both components, depicted as dashed line 828 in FIG. 8.

The superposition of two magnetization processes happening at different rates results in a bi-exponential magnetization curve 830, which can be described with following second equation:

$$M(t)'=M'_{01}(1-e^{t/T_{11}})+M'_{02}(1-e^{t/T_{12}})$$

where $M'_{01}$ is the equilibrium magnetization of component 1, t the time, $T_{11}$ the longitudinal relaxation time of component 1. $M'_{02}$ the equilibrium magnetization of component 2 and $T_{12}$ the longitudinal relaxation time of component 2.

It is possible to perform a fit for curve 830 and calculate the contribution of the individual components towards the total magnetization. In other words, the equilibrium magnetizations $M_{01}'$, $M_{02}'$ and the longitudinal relaxation times $T_{11}$, $T_{12}$ of both components can be obtained by analysing the exact shape of curve 830. As the volumetric concentration of component 1 and 2 in the effective RF-field of coil 252 in FIG. 2 is different to that of coil 251 in FIG. 2, the values for the equilibrium magnetizations $M_{01}'$, $M_{02}'$ of FIG. 8 are different to the values for the equilibrium magnetizations $M_{01}$, $M_{02}$ of FIG. 7.

It has been discovered in this invention that it is very advantageous to sample several relaxation curves of a multi-component mixture where the volumetric concentrations of the mixture components have been varied. Since the relaxation curves will be of different shape due to different local concentrations of the individual components, these relaxation curves can be evaluated and correlated in an advantageous manner. The only requirement is that the relaxation behaviour differs for each component and that the volumetric concentrations of the components are varied each time a relaxation curve is sampled.

The volumetric concentration of component 1 in the RF-coil 251 of FIG. 2 is defined in a third equation as:

$$C_{11} = M'_{01}/M'_{100\ Component1}$$

where $c_{11}$ is the volumetric concentration of component 1 in the effective RF-field of RF-coil 251, $M_{01}$ the equilibrium magnetization of component 1 enclosed in the effective RF-field of RF-coil 251, and $M_{100\ Component\ 1}$ is the equilibrium magnetization in the effective RF-field of coil 251 when filled with 100% of component 1. $M_{100\ Component\ 1}$ may also be termed as hydrogen density of component 1.

The volumetric concentration of component 2 in the RF-coil 251 of FIG. 2 is defined in a fourth equation as:

$$C_{21} = M'_{02}/M'_{100\ Component2}$$

where $c_{21}$ is the volumetric concentration of component 2 in the effective RF-field of RF-coil 251, $M'_{02}$ the equilibrium magnetization of component 2 enclosed in the effective RF-field of RF-coil 251, and $M'_{100\ Component2}$ is the equilibrium magnetization in the effective RF-field of coil 251 when filled with 100% of component 2. $M'_{100\ Component2}$ may also be termed as hydrogen density of component 2.

The volumetric concentration of component 1 in the RF-coil 252 of FIG. 2 is defined in a fifth equation as:

$$C_{12} = M'_{01}/M_{100\ Component1}$$

where $c_{12}$ is the volumetric concentration of component 1 in the effective RF-field of RF-coil 252, $M'_{01}$ the equilibrium magnetization of component 1 in the effective RF-field of RF-coil 252.

The volumetric concentration of component 2 in the RF-coil 252 of FIG. 2 is defined in a sixth equation as:

$$C_{22} = M'_{02}/M_{100\ Component2}$$

where $c_{22}$ is the volumetric concentration of component 2 in the effective RF-field of RF-coil 252, $M'_{02}$ the equilibrium magnetization of component 2 in the effective RF-field of RF-coil 252.

Since the RF-coil 251 is filled completely with component 1 and 2, the volumetric concentration $c_{11}$ of component 1 in the effective RF-field of RF-coil 251 and the volumetric concentration $c_{21}$ of component 2 in the effective RF-field of RF-coil 251 must add up to 100% in a seventh equation:

$$C_{11} + C_{12} = 100\%$$

Also, the volumetric concentration $c_{12}$ of component 1 and the volumetric concentration $c_{22}$ of component 2 in the effective RF-field of RF-coil 252 must add up to 100% in an eighth equation for the same reason as before:

$$C_{12} + C_{12} = 100\%$$

Per definition, the sum of the equilibrium magnetizations $M_{01}$ and $M_{02}$, obtained from a relaxation curve analysis, in an ninth equation can be expressed as:

$$M_{100\ Component1} C_{11} + M_{100\ Component2} C_{21} = +M_{01} + M_{02}$$

where $M_{01}$ is the equilibrium magnetization of component 1 enclosed in the effective RF-field of RF-coil 251 in FIG. 2 and $M_{02}$ is the equilibrium magnetization of component 2 enclosed in the effective RF-field of RF-coil 251 in FIG. 2 (also compare the illustration of FIG. 7).

Similarly, the sum of the equilibrium magnetizations $M'_{01}$ and $M'_{02}$, obtained from analysis from a further relaxation curve, can be expressed in an tenth equation according to the same definition as:

$$M_{100\ Component1} C_{12} + M_{100\ Component2} C_{22} = +M'_{01} + M'_{02}$$

where $M'_{01}$ is the equilibrium magnetization of component 1 enclosed in the effective RF-field of RF-coil 252 in FIG. 2 and $M'_{02}$ the equilibrium magnetization of component 2 enclosed in the effective RF-field of RF-coil 252 in FIG. 2 (compare also the illustration of FIG. 8).

The equations (3) to (10) represent an linear equation system of eight equations with six unknowns $M_{100Component\ 1}$, $M_{100Component\ 2}$, $C_{11}$, $C_{12}$, $C_{21}$ and $C_{22}$. It can be solved in an eleventh and twelfth equation to calculate the equilibrium magnetizations $M_{100Component\ 1}$ and $M_{100\ Component\ 2}$ yielding:

$$M_{100\ Component1} = (M_{02} M'_{01} - M_{01} M'_{02})/(M_{02} - M'_{02})$$

and $$M_{100\ Component2} = (M'_{01} M_{02} - M_{01} M'_{02})/(M'_{01} - M_{01})$$

The determination of the equilibrium magnetizations $M_{100\ Component\ 1}$ and $M_{100\ Component\ 2}$ is very advantageous as these values describe the hydrogen density of component 1 and 2. They provide a reference against which the experimentally determined equilibrium magnetizations $M_{01}$, $M_{02}$, $M_{01}'$ and $M_{02}'$ of the individual components can be compared in order to determine the volumetric concentration of the corresponding components.

For example, if the value of $M_{100\ Component\ 1}$ of the eleventh equation and the value for $M_{01}$, yielded by an analysis of the longitudinal relaxation curve 727 of FIG. 7, is inserted into the third equation, the volumetric concentration $C_{11}$ of component 1 in the effective RF-field of coil 251 of FIG. 2 is yielded. The volumetric concentration $C_{21}$ of component 2 in the effective RF-field of coil 251 of FIG. 2 is simply $1 - C_{11}$ according to the seventh equation.

Alternatively, the value of $M_{100\ Component\ 1}$ of the eleventh equation and the value for $M'_{01}$, yielded by an analysis of the longitudinal relaxation curve 830 of FIG. 8, can be inserted into the fifth equation, yielding the volumetric concentration $C_{12}$ of component 1 in the effective RF-field of coil 252 of FIG. 2. The volumetric concentration $C_{22}$ of component 2 in the effective RF-field of coil 252 of FIG. 2, similarly as before, is $1 - C_{21}$ according to the eighth equation.

So far, the evaluation of longitudinal relaxation curves as described with the equations (1) and (2), and as depicted in FIG. 7 and FIG. 8, has been considered for determining the volumetric concentrations of the individual components of a multi-component mixture. However, the evaluation of transverse relaxation curves, also known as $T_2$-relaxation curves, is an alternative provided the transverse relaxation times are different for each component of the multi-component mixture. In oil production, for example, the transverse relaxation times of solid hydrocarbons, such as waxes, are, in general, more than three magnitudes shorter compared to the transverse relaxation time of liquids, such as crude oil. Hence, it is possible to determine the volumetric concentrations of wax and crude oil by sampling the transverse relaxation curves of such a multi-component mixture, at several positions along the pipe.

Such $T_2$-relaxation curves can be obtained, e.g. by sampling a conventional free induction decay (FID). The FID may be generated, for example, by applying an initial 90°-pulse. For slower relaxing material (in terms of transverse relaxation), it may be appropriate to sample $T_2$-relaxation curves with a conventional CPMG pulse sequence. Alternatively, other methods, such as the Hahn spin-echo, may be used instead. It is possible to analyse the shape of the obtained $T_2$-relaxation curve with a curve fitting routine yielding information on transverse relaxation times and volumetric concentrations of the individual components of the multi-component mixture.

Figure 9:
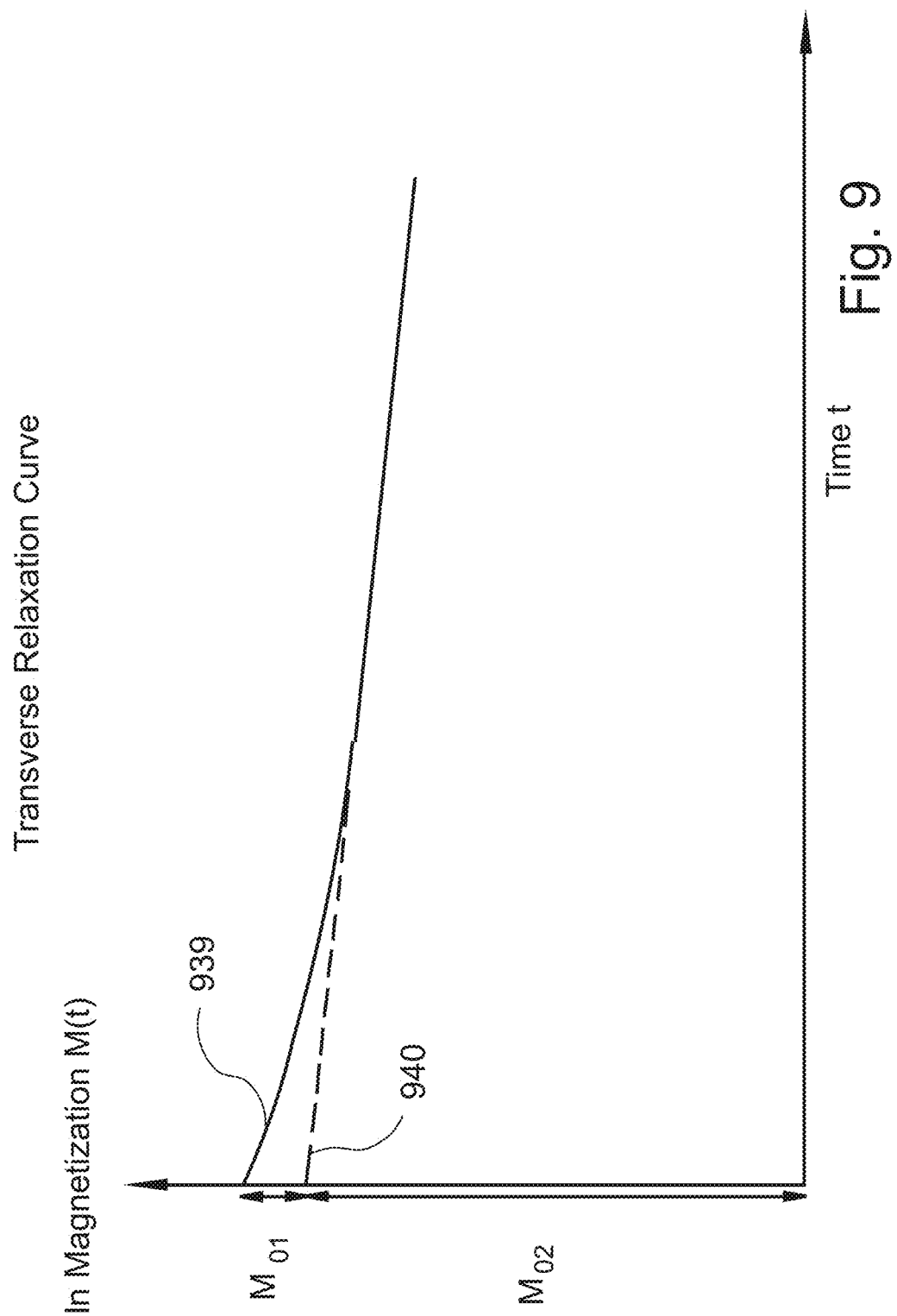
FIG. 9 shows a transverse relaxation curve sampled with the NMR sensor at position 254 of FIG. 2.

Attention is now drawn to FIG. 9 of the drawings which illustrates the typical transverse relaxation curve of a multi-component mixture which consists, for example, of gas (which may be referred to as component 1) and oil (which may be referred to as component 2) in a semi-logarithmic plot.

FIG. 9 plots the measured magnetization M(t) of the material enclosed in the effective field of RF-coil 254 of FIG. 2 against time t in a semi-logarithmic scale. As the material enclosed consists of two components with substantially different transverse relaxation times $T_{21}$ for component 1 and $T_{22}$ for component 2 (the transverse relaxation time of gas is significantly shorter than that of oil), the magnetization decay happens at different rates for the two components. The magnetization of the two components superimpose on each other and a bi-exponential relaxation curve 939 is yielded. It is possible to analyze the shape of the curve 939 and determine the contribution of component 2 to the total magnetization M(t). The dashed line of curve 940 shows how the transverse magnetization of component 2 decays from its initial signal amplitude $M_{02}$ down to naught.

The equation for the transverse relaxation curve 939, is, almost identical to equation (1) and (2). In the effective field of the RF-coil 254 of FIG. 2, the decay of the transverse magnetization can be described with following thirteenth equation:

$$M(t)=M_{01}e^{t/T_{21}}+M_{02}e^{t/T_{22}}$$

where M(t) is the measured transverse magnetization in time, $M_{01}$ the initial signal amplitude of component 1, t the time, $T_{21}$ the transverse relaxation time of component 1, $M_{02}$ the initial signal amplitude of component 2 and $T_{22}$ the transverse relaxation time of component 2.

Figure 10:
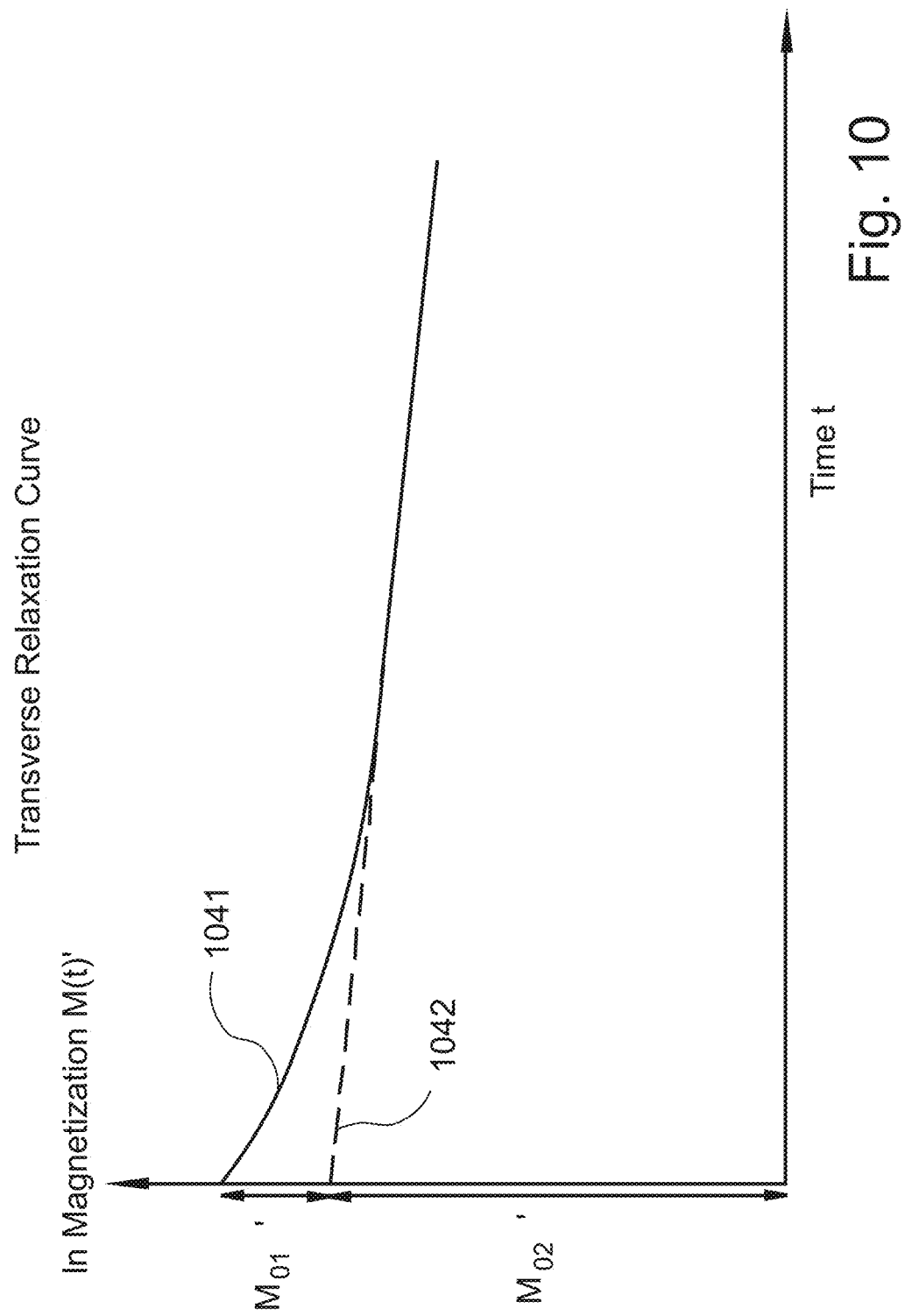
FIG. 10 shows a transverse relaxation curve sampled with the NMR sensor at position 255 of FIG. 2.

Attention is next drawn to FIG. 10 of the drawings which plots the measured magnetization M(t)' of the material enclosed in the effective field of RF-coil 255 of FIG. 2 against time t in a semi-logarithmic scale. Again, FIG. 10 qualitatively illustrates a transverse relaxation curve. The only difference to FIG. 9 is that the volumetric concentrations of components 1 and 2 enclosed in the effective RF-field of coil 255 in FIG. 2 are different to the volumetric concentrations found in the effective RF-field of coil 254 in FIG. 2. Though the components 1 and 2 are identical to those of FIG. 9 and have identical transverse relaxation times $T_{21}$ and $T_{22}$, the shape of the magnetization curve 1041 of FIG. 10 is different due to different composition of the mix enclosed in the effective RF-field of coil 255 in FIG. 2.

Again, the semi-logarithmic plot of the transverse magnetization decay depicted in FIG. 10 happens at different rates for the two components. The magnetization of the two components superimpose on each other, and a bi-exponential decay curve 1041 is yielded. It is possible to analyse the shape of the curve 1041 and determine, for example, the contribution of component 2 to the total magnetization M(t)'. The dashed line of curve 1042 shows how the transverse magnetization of component 2 decays from its initial signal amplitude $M'_{02}$ down to naught.

The decay of the transverse magnetization in the effective field of the RF-coil 255 of FIG. 2 can be described with following fourteenth equation:

$$M'(t)=M'_{01}e^{t/T_{21}}+M'_{02}e^{t/T_{22}}$$

where M(t)' is the measured transverse magnetization in time, $M_{01}'$ the initial signal amplitude of component 1, t the time, $T_{21}$ the transverse relaxation time of component 1, $M_{02}'$ the initial signal amplitude of component 2 and $T_{22}$ the transverse relaxation time of component 2.

The initial signal amplitudes $M_{01}$, $M_{02}$, $M'_{01}$ and $M'_{02}$ obtained by carrying out a curve fit to the transverse relaxation curves of FIG. 9 and FIG. 10 are similar to the equilibrium magnetizations $M_{01}$, $M_{02}$, $M'_{01}$ and $M'_{02}$ obtained by analysing the longitudinal relaxation curves of FIG. 7 and FIG. 8. They can be evaluated the same way as previously discussed.

The algorithm so far was explained for the analysis of mixtures containing two components inside the sensitive volume of a RF-coil. However, the disclosed invention allows also a direct determination of longitudinal or transverse relaxation times, hydrogen densities and volume concentrations of a multi-component mixture consisting of more than two components, as well.

For example, for a three component mixture, the linear equation system with the eight equations (3) to (10) with six unknowns:

$$M_{100Component\ 1}, M_{100Component2},$$

$$c_{11}, c_{12},$$

$$c_{21}, c_{22}$$

turns into a linear equation system of 15 equations of the same systematic as laid out before with 12 unknowns:

$$M_{100Component\ 1}, M_{100Component2}, M_{100Component2},$$

$$c_{11}, c_{12}, c_{13}$$

$$c_{21}, c_{22}, c_{33},$$

It would require the sampling of at least three different relaxation curves, each with different volumetric concentrations of their components. A curve fitting routine applied to these relaxation curves would yield the equilibrium magnetisations $M_{01}$, $M_{02}$, $M_{03}$, $M_1'$, $M_{02}'$, $M_{03}'$, $M_{01}''$, $M_{02}''$ and $M_{03}''$. That data would be evaluated according to the same system as laid out before in order to determine all unknowns.

So in general, for a multi-component mixture consisting of n components, with each component differing in its relaxation behaviour from all other components, at least n relaxation curves need to be sampled, each with a different volumetric composition of its constituents. This results in an equation system of $n^2+2*n$ linear equations with $n^2+n$ unknowns, which always could be solved.

So far, the in-situ measurement of relaxation times, hydrogen densities and volumetric concentrations by means of NMR has been laid out only for way a). There, use has been made of several RF-coils having different volumetric concentrations of mixture components inside their sensitive volumes. It is also possible to do this kind of in-situ measurement using an apparatus that relies on one RF-coil only. For this alternative way b) it is necessary to change the volumetric concentrations after sampling of each relaxation curve by removing and/or adding further material to the trapped mixture of interest. This alternative way b), of course, would also be practical for a multi-coil apparatus as described under way a).

Figure 11:
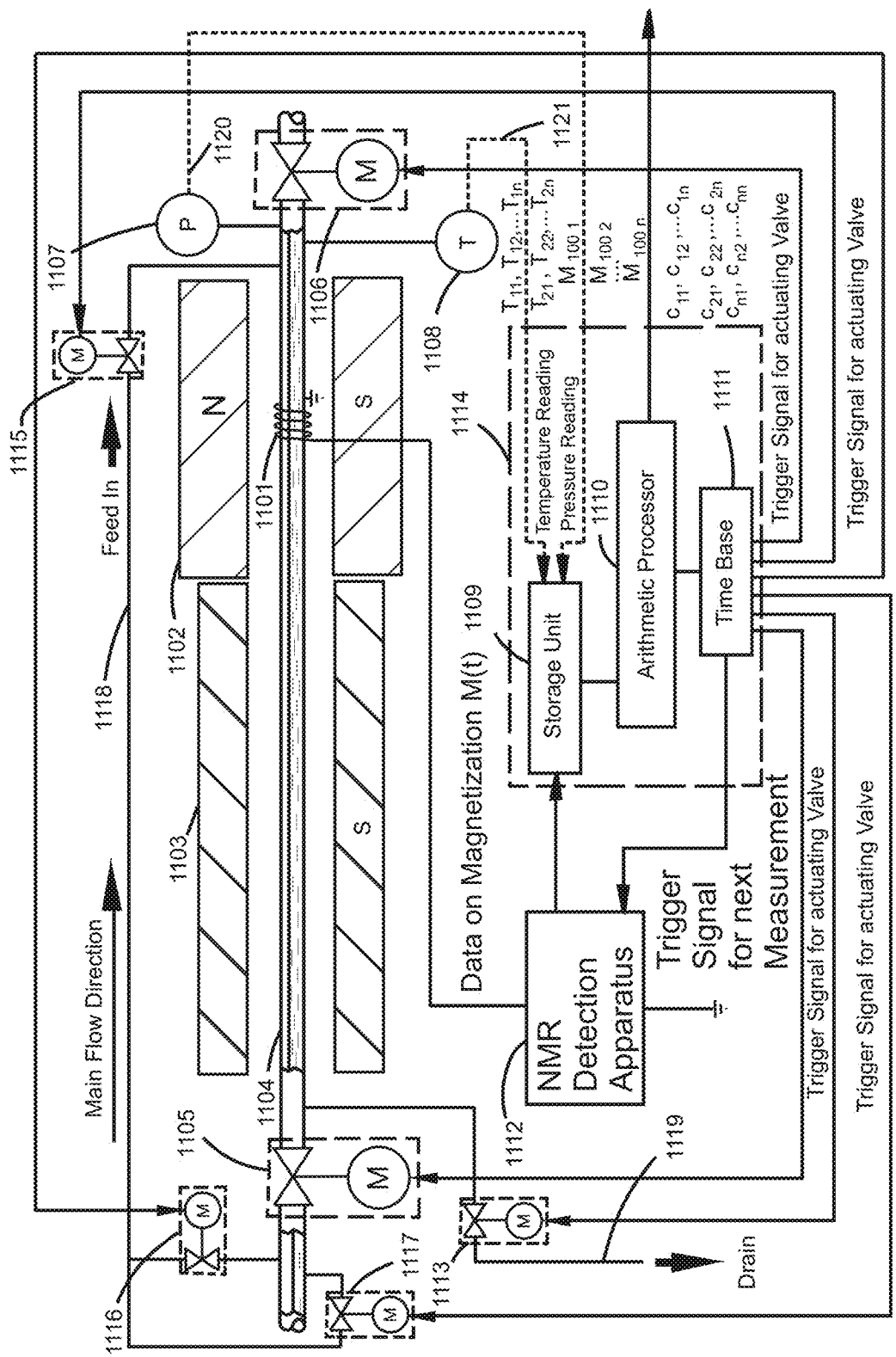
FIG. 11 shows an apparatus to measure the longitudinal or transverse relaxation times, hydrogen densities and the volumetric concentrations of the individual components of an entrapped multi-component mixture by using just one RF-coil. In order to vary the volumetric concentrations of the mixture, the apparatus is fitted with means for adding and removing material, which alters the volumetric concentration of the components of the mixture.

Attention is next drawn to FIG. 11 of the drawings which shows a NMR flow meter which consists of one RF-coil 1101 placed inside a detection magnet 1102 and a pre-polarization magnet 1103.

Inside this magnet arrangement, a non-conductive and non-magnetic pipe 1104 is placed which can be shut off from the process stream with the valves 1105 and 1106 in order to trap a mixture of interest inside for in-line fluid characterization. Pressure of the trapped mixture is measured with a pressure sensor 1107 and transferred to storage unit 1109 via line 1120 and temperature of the trapped mixture is measured with a temperature sensor 1108 and transferred to storage unit 1109 via line 1121, as set out similarly before in description of FIG. 2.

The RF-coil 1101 is connected to a NMR detection apparatus 1112, which in turn is connected to a device 1114 for signal evaluation and actuator control. This device 1114 in turn, comprises a storage unit 1109 for storing the raw NMR data on magnetization, an arithmetic processor 1110 and a time base 1111. In order to change volumetric composition of the entrapped mixture after each relaxation measurement, a device for discharge and/or filling is added. In its most simple form, this can be a drain valve 1113 allowing discharging some of the mixture (which is under pressure in case of an oil/gas mix) via line 1119 in a controlled manner. Alternatively, the pipe 1104 can be fed with additional material via valve 1115. It may be connected, for example, via two valves 1116 and 1117 and a feed line 1118 to the high pressure side of NMR detection apparatus 1112 in order to fill some more gas or oil to the entrapped oil/gas mixture in a controlled manner. There are many more ways of altering the volumetric composition of the mixture entrapped inside pipe 1104 and there is no intent to exhaustively list all technical alternatives there.

No matter whether the enclosed mixture is topped up or discharged to some extent, the mixture pressure will be altered. For a liquid (which in general can be regarded as in-compressible), this will alter its hydrogen density only to a very small extent compared to gas. Hence, for liquids this effect can be neglected. But for a gas, such as methane, it has a strong impact on hydrogen density. A fifteenth equation, the ideal gas law is:

$$pV=NRT$$

where p is the pressure, V the volume, N is the amount of substance of gas (also known as number of moles), R the ideal gas constant and T the absolute temperature of the gas.

The amount of substance of a gas like methane is directly proportional to the hydrogen density measured by means of NMR. The fifteenth equation resolved for N yields a sixteenth equation:

$$N=pV/RT$$

If that amount is changed by filling in more gas to the same volume, a second value for the amount of substance of a gas N' may be introduced, which yields:

$$N'=p'V/RT'$$

where p' is the pressure and T' the temperature of the gas after filling more gas into the given volume V. For example, in an isothermal process this means doubling the pressure of methane will double its hydrogen density.

The amount of substance of a hydrogen bearing gas, such as methane, directly corresponds to the detected hydrogen density in NMR. That means, the ratio of $$M_{100\ Component1}/N = M'_{100\ Component1}/N'$$

is a constant one. Inserting equation sixteen and equation seventeen into equation eighteen and solving for $M'_{100\ Component\ 1}$ yields nineteenth equation:

$$M'_{100\ Component1} = M_{100\ Component1} Tp'/pT'$$

In a given oil and gas mixture, suppose the gas fraction is referred to as component 1 and the oil fraction of the mixture is referred to as component 2. For equations nine and ten this means, that equation nine can remain the same, but equation ten needs to be modified to accommodate the effect of a changed pressure for the hydrogen density of component 1 in equation twenty.

$$M'_{100\ Component1} C_{12} + M_{100\ Component2} C_{22} = M'_{01} + M'_{02}$$

Equation nineteen inserted into equation twenty yields equation twenty one:

$$(M_{100\ Component1} Tp'/pT''C_{12}) + M_{100\ Component2} C_{22} = M'_{01} + M'_{02}$$

Equation twenty one together with equations three through nine represents a linear equation system of eight equations with six unknowns, namely $M_{100\ Component\ 1}$, $M_{100\ Component\ 2}$, $C_{11}$, $C_{12}$, $C_{21}$ and $C_{22}$. Such an equation system can be solved in order to calculate the equilibrium magnetizations $M_{100\ Component\ 1}$, $M_{100\ Component\ 1}'$ and $M_{100\ Component\ 2}$ yielding equations twenty two, twenty three and twenty four:

$$M_{100\ Component\ 1} = (M_{02} M'_{01}/(Tp'/pT) - M_{01} M'_{02})/(M_{02} - M'_{02})$$

$$M'_{100\ Component\ 1} = (M_{02} M'_{01} - (M_{01} M'_{02} Tp'/pT))/(M_{02} - M'_{02})$$

$$M_{100\ Component\ 2} = ((M_{01} M'_{02} Tp'/pT) - M'_{01} M_{02})/((M_{01} Tp'/pT) - M'_{01})$$

Equation twenty two, twenty three and twenty-four are very similar to equation eleven and twelve, the difference being only the pressure and temperature correction term.

Just as before, the determination of the equilibrium magnetizations $M_{100\ Component\ 1}$, $M'_{100\ Component\ 1}$ and $M_{100\ Component\ 2}$ is very advantageous as these values describe the hydrogen density of component 1 and 2. They provide a reference against which the experimentally determined equilibrium magnetizations $M_{01}$, $M_{02}$, $M_{01}'$ and $M_{02}'$ of the individual components can be compared in order to determine the volumetric concentration.

For example, if the value of $M_{100\ Component\ 1}$ of equation twenty two and the value for $M_{01}$, yielded by an analysis of the transverse relaxation curve 939 of FIG. 9, is inserted into equation three, the volumetric concentration $C_{11}$ of component 1 in the effective RF-field of coil 1101 of FIG. 11 is yielded. The volumetric concentration $C_1$ of component 2 in the effective RF-field of coil 1101 of FIG. 11 is simply $1-C_{11}$.

Alternatively, the value of $M_{100\ Component\ 2}$ of equation twenty-four and the value for $M_{02}'$, yielded by an analysis of the longitudinal relaxation curve 1041 of FIG. 10, can be inserted into equation six, yielding the volumetric concentration $C_{22}$ of component 2 in the effective RF-field of coil 1101 of FIG. 11. $M_{02}'$ is determined by back extrapolating the signal from component 2 only, indicated by the dashed line 1042 in FIG. 10. The volumetric concentration $c_{12}$ of component 1 in the effective RF-field of coil 1101 of FIG. 11, similarly as before, is $1-C_{22}$ according to equation eight.

Figure 12:
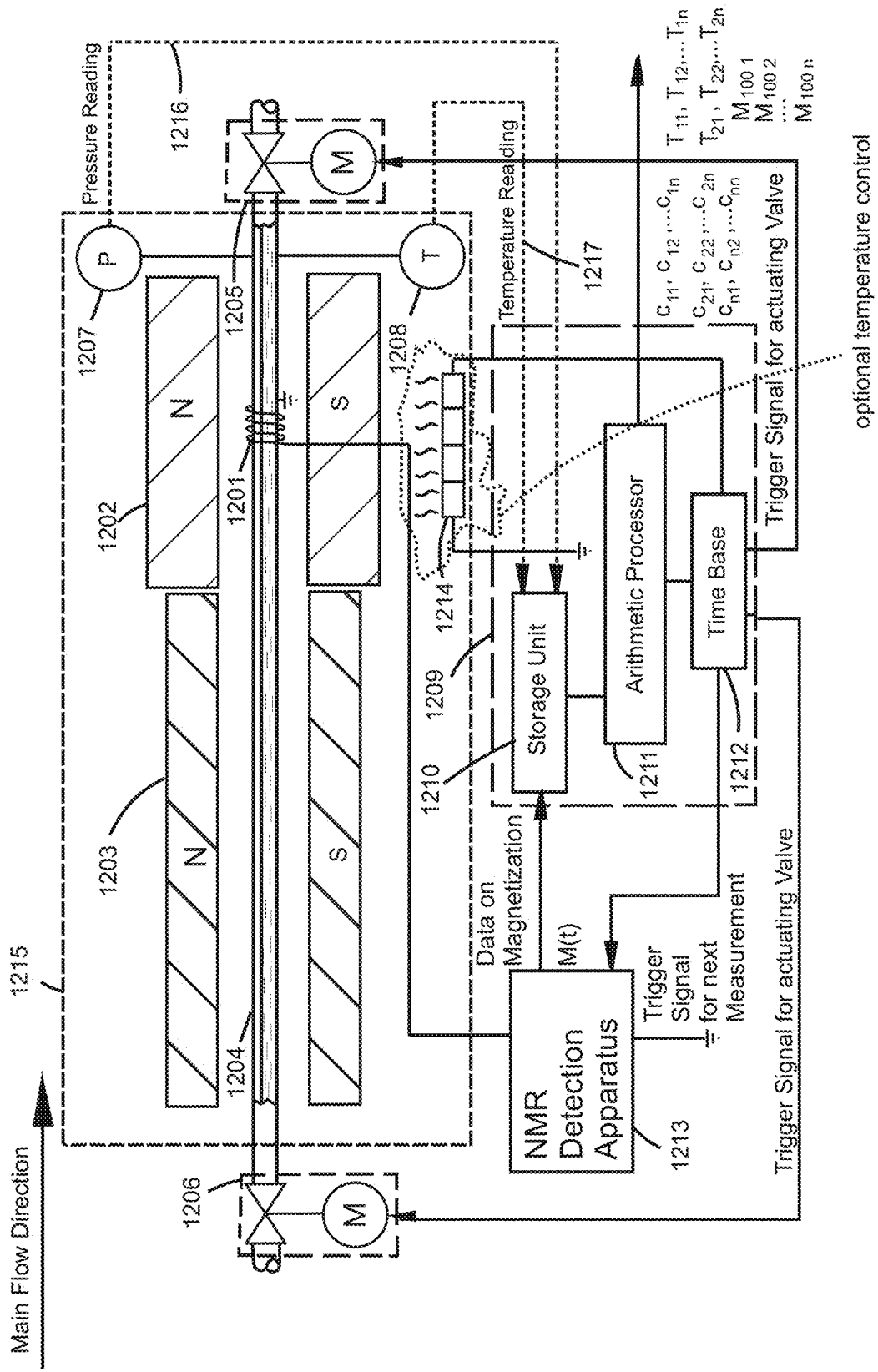
FIG. 12 shows an apparatus to measure the longitudinal and transverse relaxation times hydrogen densities and the volumetric concentrations of the individual components of an entrapped multi-component mixture by also using just one RF-coil. In order to vary the volumetric concentrations of the mixture, the apparatus is fitted with means to change the phase equilibrium of the mixture as an alternative.

Instead of removing or adding further material to the trapped mixture of interest as disclosed in way b) it is possible to alter the phase equilibrium of the mixture. This approach is termed way c) for the purpose of this disclosure. This alternative way c), of course, would also be practical for a multi-coil apparatus as described under way a) and for a single-coil apparatus as described under way b). In order to describe way c) in more detail, attention is next drawn to FIG. 12 of the drawings. FIG. 12 shows a NMR flow meter which consist of a RF-coil 1201, a detection magnet 1202 and a pre-polarization magnet 1203 in which a electrically non-conducting and non-magnetic pipe 1204 is placed, which can be shut off from the process stream with the valves 1205 and 1206 in order to trap a mixture of interest inside for in-line fluid characterization. Pressure of the trapped mixture is measured with a pressure sensor 1207 and transferred to storage unit 1210 via line 1216 and temperature of the trapped mixture is measured with a temperature sensor 1208 and transferred to storage unit 1210 via line 1217, as set out similarly before in description of FIG. 2.

The RF-coil 1201 is connected to a NMR detection apparatus 1213, which in turn is connected to a device 1209 for signal evaluation and actuator control. This device 1209 in turn, comprises a storage unit 1210 for storing the raw NMR data on magnetization, an arithmetic processor 1211 and a time base 1212. The NMR apparatus is placed inside a casing (indicated by dashed line 1215) which acts as a thermal barrier against the environment. Inside the casing, an optional heating device 1214 is placed to thermally control the mixture enclosed inside the NMR flow meter. Instead of a heating device a cooling device or a pressure setting device would also be possible. What is more, if process conditions are favorable, no cooling nor heating at all would be required for the disclosed invention. Such favourable process conditions would mean that the process fluid, being a mixture of oil and gas, for example, would have a significantly higher temperature than the environment. In practice, the mixture coming from the well could have a temperature in the range of 70° C., whereas the environment the flow meter operates in, could have a temperature of 10° C. If a segment of the oncoming flow is trapped inside the pipe 1204 by means of valve 1205 and 1206, the entrapped mixture slowly cools down. This cool down leads to a change in the mixture pressure and temperature which in turn, changes the mixture composition of an oil/gas mixture as described earlier on for way c).

Carrying out relaxation measurements during the cool down period leads to different relaxation curves which can be cross-correlated for signal evaluation the same way as laid out before for way b). The algorithms are the same and therefore need not be repeated.

The invention claimed is:

1. A method of measurement of hydrogen density, volumetric concentrations, and longitudinal relaxation times and transverse relaxation times of individual components of a multi-component mixture having n components by means of nuclear magnetic resonance, wherein the longitudinal relaxation times or the transverse relaxation times of all n components in pairs are different to each other, comprising the steps of:
   a) enclosing a mixture inside a probe volume and polarizing the mixture with a magnetic field;
   b) measuring the mixture enclosed inside the probe volume in terms of its longitudinal or transverse relaxation behaviour by means of pulsed electromagnetic waves at least n times with a different volumetric share of its components to measure at least n different relaxation curves;
   c) obtaining the relaxation times from the relaxation curves;
   d) obtaining the thermal equilibrium magnetizations $M_0$ of the individual components from the relaxation curves; and
   e) correlating yielded thermal equilibrium magnetizations $M_0$ of the individual components to calculate the hydrogen densities and the volumetric share of the components for each relaxation curve.

2. The method of measurement of claim 1, further including the steps of: generating different relaxation curves from local variations of volumetric concentrations of the mixture components inside the probe volume; and in which several RF coils are used, each of them having the mixture components present in its sensitive volumes in different volumetric shares.

3. The method of measurement of claim 1, further including the steps of: generating different relaxation curves with at least one RF coil, in whose sensitive volume the volumetric share of the components of the mixture is varied in time by feeding in and/or discharging material; and measuring pressure and temperature inside the probe volume for each relaxation curve.

4. The method of measurement of claim 1, wherein the different relaxation curves are generated by using at least one RF coil, in whose sensitive volume a change of the phase equilibrium of the mixture is achieved by changing the pressure or the temperature or by changing the pressure and the temperature, which in turn, varies the volumetric share of the components of the mixture in time, and wherein pressure and temperature inside the probe volume are measured for each relaxation curve also.

5. The method of measurement of claim 1, wherein during the measurement a bypass is activated which routes the multi-component mixture around the lockable probe volume in order to avoid process outages.

6. The method of measurement of claim 1, wherein pressure and temperature of the mixture are continuously measured in order to verify whether the measured pressure and/or temperature of the free flowing mixture drifts when comparing it to the previously measured enclosed mixture.

7. An apparatus for measurement of hydrogen density, volumetric concentrations, longitudinal and/or transverse relaxation times of the individual components of a multi-component mixture consisting of n components by means of nuclear magnetic resonance, where at least the longitudinal or the transverse relaxation times of all n components in pairs are different to each other, comprising:
   a) at least one probe volume with valves at the entrance and exit, which enclose the mixture to be measured in the probe volume;
   b) at least one first RF coil comprising a sensitive volume in which the at least one first RF coil is sensitive for RF signals, wherein the at least one first RF coil is placed at a first position along the probe volume with its sensitive volume towards the probe volume in order to receive RF signals emitted in the probe volume;
   c) a means for variation of the volumetric share of the mixture components inside the probe volume, selected from the following group of:
      i) a means for generating a local variation of the volumetric concentration of the mixture components by separation inside the probe volume, wherein at least one second RF coil is placed at a second position along the probe volume different to the first position in such a way that the at least one first RF coil and the at least one second RF coil find different volumetric concentrations of the mixture inside their sensitive volumes;

ii) a means for generating a variation of the volumetric concentration of the mixture components inside the probe volume and thereby in the sensitive volume of the at least one first RF coil in time by feeding in and/or discharging material to the mixture enclosed inside the probe volume, and which comprises at least one pressure sensor and one temperature sensor for the mixture enclosed inside the probe volume; or iii) a means for changing the temperature and/or the pressure of the multi-component mixture enclosed inside the probe volume in order to generate a variation of the volumetric concentration of the mixture components inside the sensitive volume of the at least one first RF coil in time, and which comprises at least one pressure sensor and one temperature sensor for the mixture enclosed inside the probe volume;

d) at least one magnet device which is arranged such that the sensitive volume of each RF-coil is placed in the magnetic field of the magnet device;

e) at least one NMR detection apparatus comprising a pulse generator for generation of excitation pulses and a receiver for the detection of nuclear magnetic resonance signals which is connected to the RF coils; and f) a device for evaluation of the oncoming signals and control of actuators attached to the apparatus.

8. The apparatus of claim 7, further comprising a tank circuit damping device, wherein the damping coefficient is configured to be variable in time to dampen the alternating field of the RF coils.

9. The apparatus of claim 7, wherein a lockable probe volume is of elongated geometry, preferably inclined in its axis towards the horizon.

10. The apparatus of claim 7, in which at least one RF coil has a diameter shorter than the smallest cross-sectional width of the probe volume containing the multi-component mixture.

11. The apparatus of claim 7, further comprising a blockable bypass which is fitted such that the multi-component mixture can flow around the lockable probe volume for the duration of the measurement.

12. The apparatus of claim 7, further comprising a continuously operating pressure and temperature sensor.

* * * * *